US 6,570,471 B2

(12) United States Patent
Inoue et al.

(10) Patent No.: US 6,570,471 B2
(45) Date of Patent: May 27, 2003

(54) SURFACE ACOUSTIC WAVE LADDER FILTER HAVING AT LEAST ONE RESONATOR WITH ELECTRODE FINGER PAIRS IN INVERTED ORIENTATION

(75) Inventors: Shogo Inoue, Kawasaki (JP); Jun Tsutsumi, Kawasaki (JP); Takashi Matsuda, Kawasaki (JP); Osamu Ikata, Kawasaki (JP)

(73) Assignees: Fujitsu Limited, Kawasaki (JP); Fujitsu Media Devices Limited, Nagano (JP)

( * ) Notice: Subject to any disclaimer, the term of this patent is extended or adjusted under 35 U.S.C. 154(b) by 39 days.

(21) Appl. No.: 09/915,550

(22) Filed: Jul. 27, 2001

(65) Prior Publication Data

US 2002/0036550 A1 Mar. 28, 2002

(30) Foreign Application Priority Data

Sep. 28, 2000 (JP) .................... 2000-296671
Apr. 18, 2001 (JP) .................... 2001-120011

(51) Int. Cl.⁷ .................................. H03H 9/64
(52) U.S. Cl. ........................ 333/195; 310/313 B
(58) Field of Search ................... 333/193–196; 310/313 B

(56) References Cited

U.S. PATENT DOCUMENTS 3,663,899 A * 5/1972 Dieulesaint ............ 333/193 X
3,792,381 A * 2/1974 Bristol .................... 333/193
5,844,453 A * 12/1998 Matsui et al. ........... 333/193
6,259,336 B1 * 7/2001 Ichikawa ................. 333/193
6,344,705 B1 * 2/2002 Solal et al. ............. 310/313 B

FOREIGN PATENT DOCUMENTS

JP          11-163664       6/1999
JP          2000-315931     11/2000

OTHER PUBLICATIONS

Y. Satoh et al., "Resonator–Type Low–Loss Filters", *Proc. Int. Symp. SAW Devices for Mobile Comm.*, pp. 179–185, 1992.

* cited by examiner

Primary Examiner—Barbara Summons
(74) Attorney, Agent, or Firm—Armstrong, Westerman & Hattori, LLP

(57) ABSTRACT

A surface acoustic wave filter includes a piezoelectric substrate having formed thereon plural surface acoustic wave resonators electrically connected in a ladder form for exciting a surface acoustic wave, wherein each of the surface acoustic wave resonators is composed of an interdigital transducer and reflectors arranged closely on both sides of the transducer in a direction parallel to a propagation direction of the excited surface acoustic wave; the interdigital transducer of at least one of the surface acoustic wave resonators is composed of a prescribed number of pairs of comb form electrodes; and the surface acoustic wave excited by the pairs of comb form electrodes contains two kinds of surface acoustic waves having phases that are different from each other by 180°.

8 Claims, 20 Drawing Sheets

FIG. 14 (a) (Prior Art)
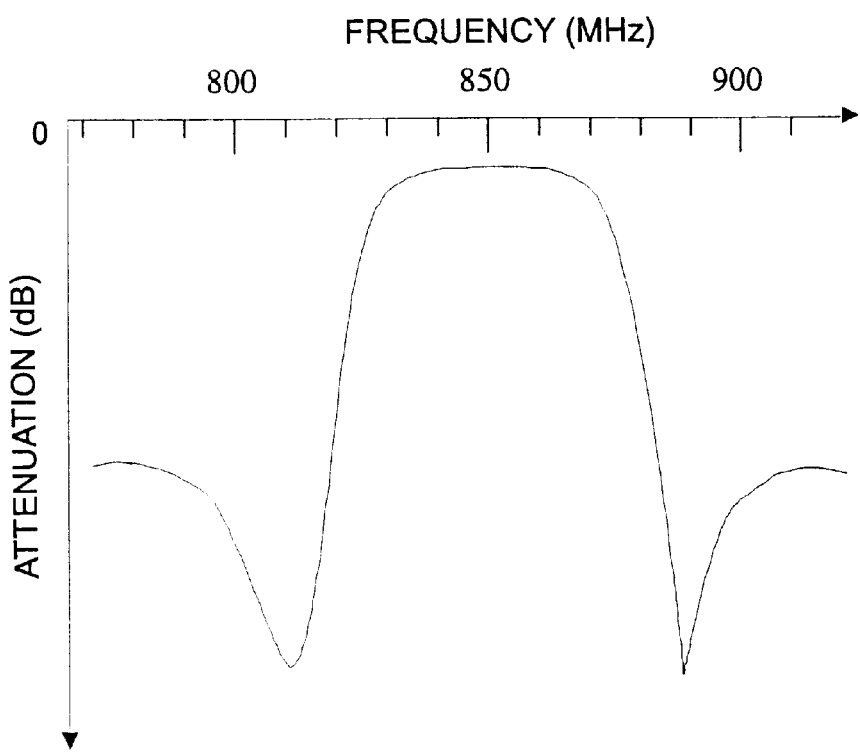
FIG. 14 (b) (Prior Art)
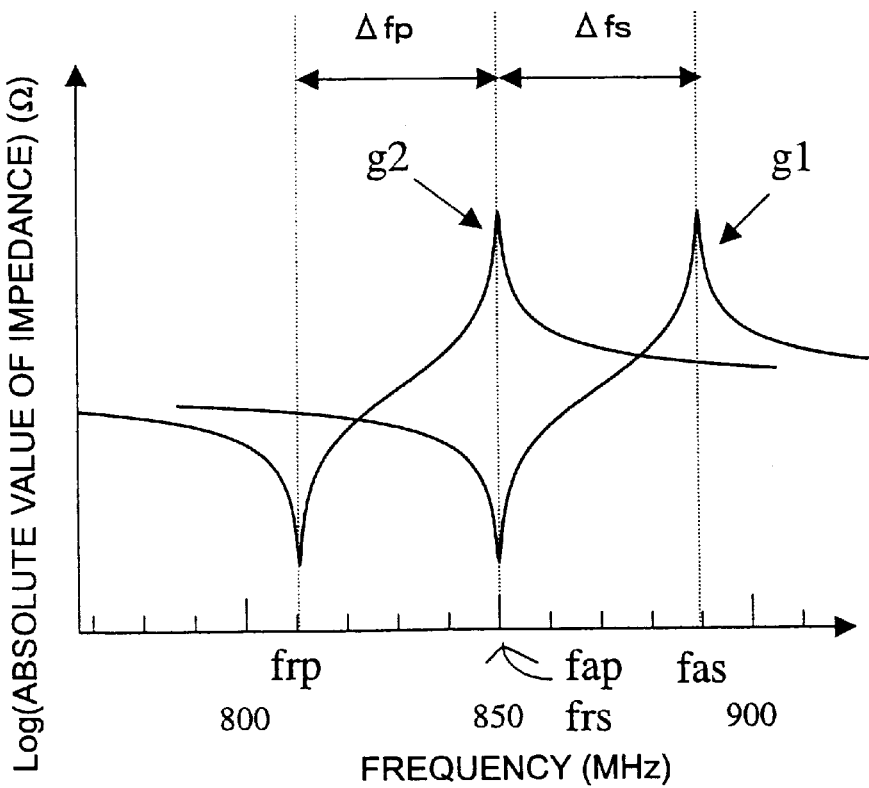

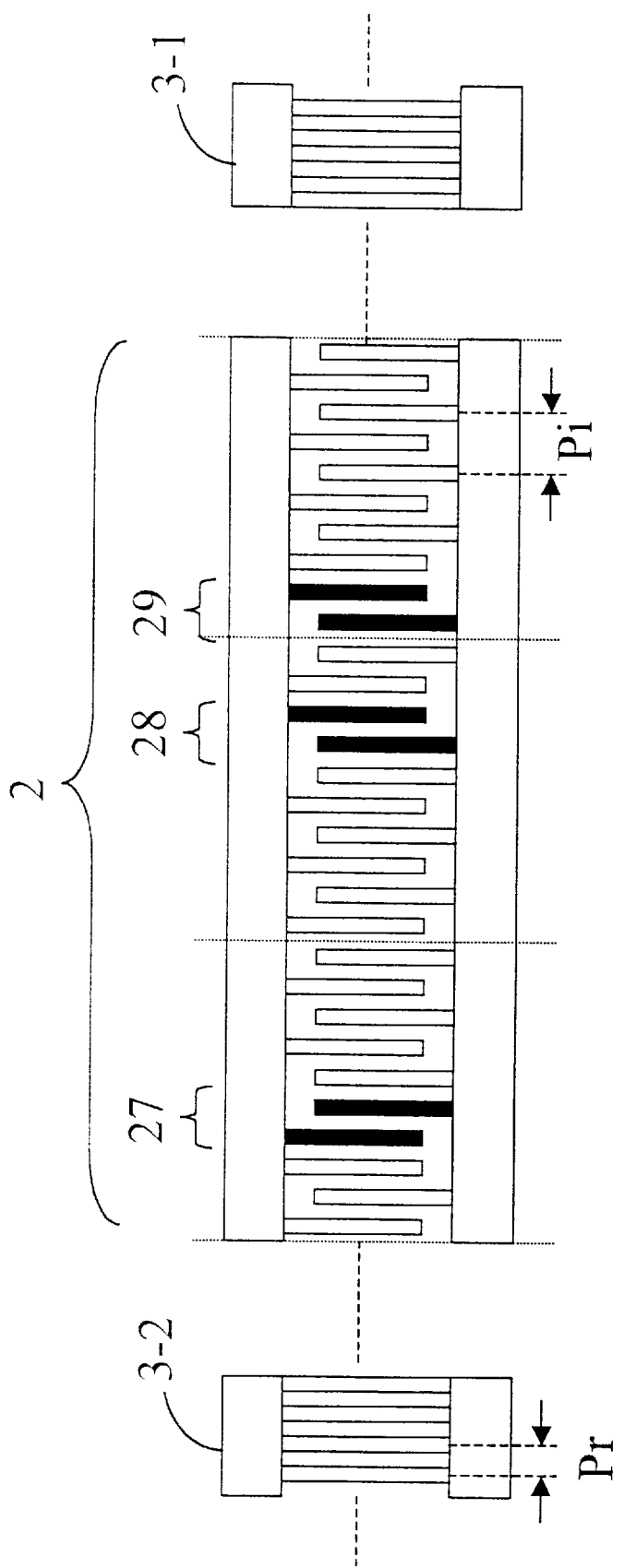

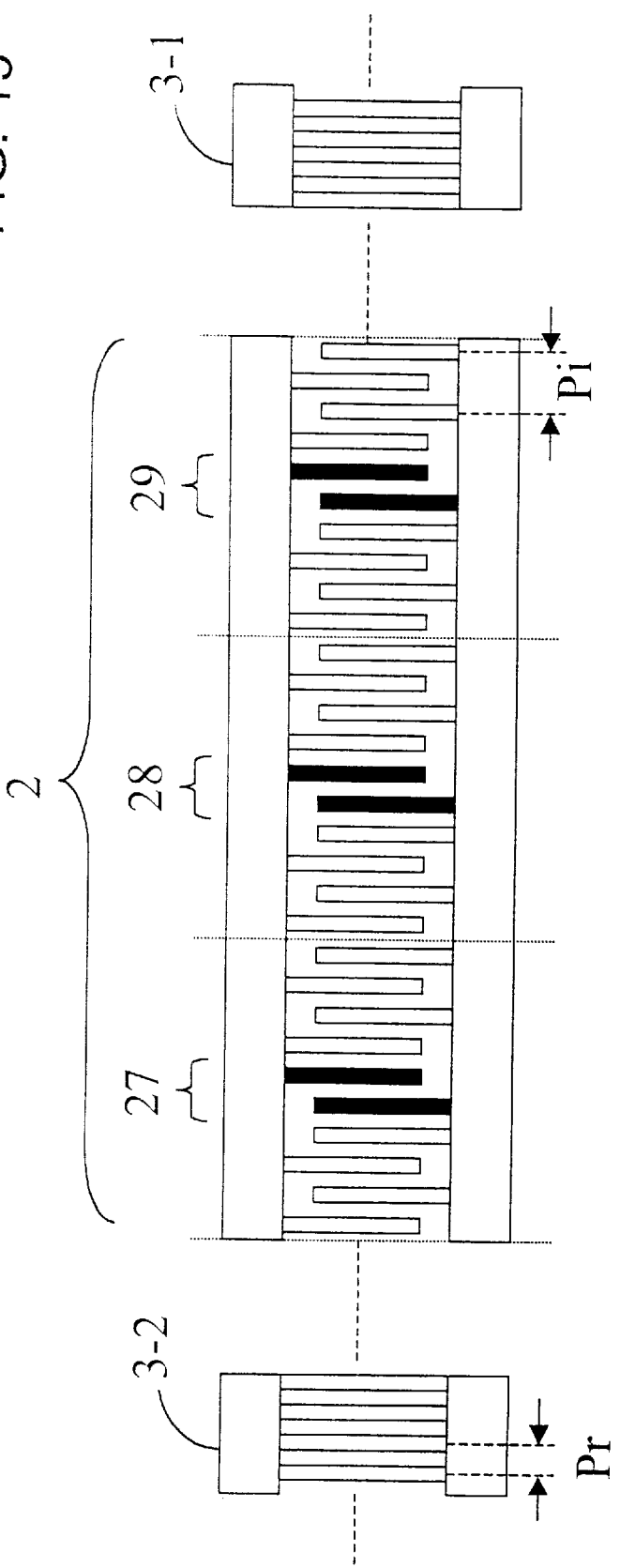

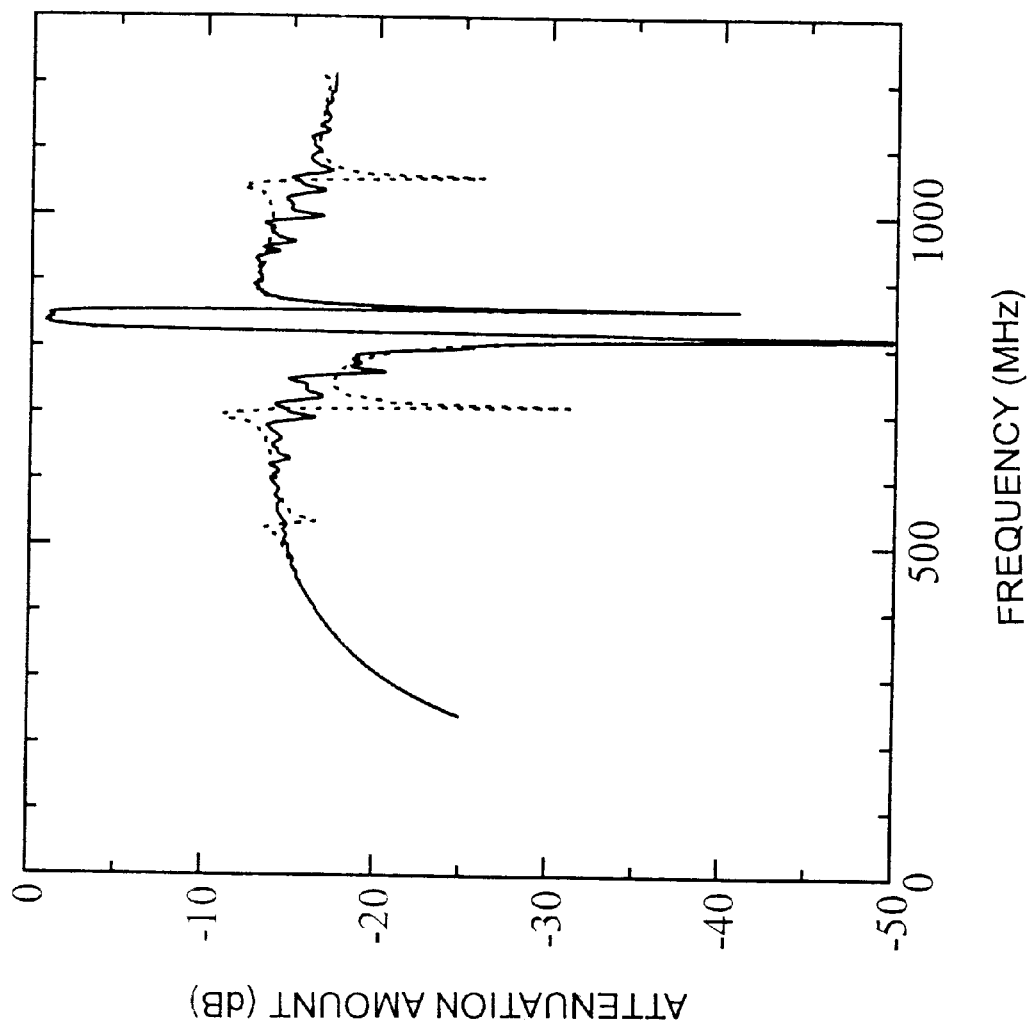

SURFACE ACOUSTIC WAVE LADDER FILTER HAVING AT LEAST ONE RESONATOR WITH ELECTRODE FINGER PAIRS IN INVERTED ORIENTATION

CROSS-REFERENCE TO RELATED APPLICATION

This application is related to Japanese Patent Application No. 2000-296671 filed in Sep. 28, 2000 and 2001-120011 filed in Apr. 18, 2000, whose priorities are claimed under 35 USC §119, the disclosure of which is incorporated by reference in its entirety.

BACKGROUND OF THE INVENTION

1. Field of the Invention

The present invention relates to a surface acoustic wave filter, and more particularly, it relates to a ladder type surface acoustic wave filter having plural surface acoustic wave resonators arranged in a series-arm and a parallel-arm.

2. Description of the Related Art

A ladder type surface acoustic wave (hereinafter referred to as SAW) filter using plural SAW resonators has been known as a band pass filter (see, for example, Journal of Institute of Electronics, Information and Communication Engineers A, Vol. J 76-A, No. 2, pp. 245–252 (1993)).

FIG. 12 shows a constitutional diagram of a conventional ladder type SAW filter.

A ladder type SAW filter has such a constitution that series-arm SAW resonators $S_1$ an $S_2$ are arranged between an input terminal Ti and an output terminal To of a piezoelectric substrate 1, and parallel-arm SAW resonators $P_1$ and $P_2$ are arranged between the input and output terminals and a ground terminal G. SAW resonators $S_1$, $S_2$, $P_1$, $P_2$, are generally called one-part SAW resonators.

FIG. 13 shows a constitutional diagram of a one-part SAW resonator. A one-part SAW resonator has such a constitution that an interdigital transducer (hereinafter referred to as IDT) 2 for electrically exciting SAW and reflectors 3-1 and 3-2 arranged on a propagation path of the SAW for trapping the excited SAW in the IDT are formed on the piezoelectric substrate 1.

The IDT 2 is formed with a large number of electrode fingers arranged in a comb form with a constant period (pi).

The reflectors 3-1 and 3-2 each is formed with a large number of grating electrode fingers 3-3 arranged with a constant period (pr) and is also referred to as a grating reflector.

In the IDT, the SAW is excited by two adjacent electrode fingers each extending downward and upward as one unit.

A ladder type SAW filter is designed in such a manner that a resonance frequency fr of the series-arm SAW resonators $S_1$ and $S_2$ substantially agrees to an antiresonance frequency fa of the parallel-arm SAW resonators $P_1$ and $P_2$.

FIG. 14(a) is a graph showing a pass characteristic diagram of a ladder type SAW filter, and FIG. 14(b) is a graph showing single impedance characteristic diagrams at this time of the series-arm SAW resonators $S_1$ an $S_2$ and the parallel-arm SAW resonators $P_1$ and $P_2$. The graph $g_1$ in FIG. 14(b) is an impedance characteristic of the series-arm SAW resonators $S_1$ an $S_2$, and the graph $g_2$ is an impedance characteristic of the parallel-arm SAW resonators $P_1$ and $P_2$. In the graph $g_1$ of the series-arm SAW resonators, the frequency where the impedance becomes minimum is the resonance frequency frs, and the frequency where the impedance becomes maximum is the antiresonance frequency fas.

FIG. 15 is an explanatory diagram of frequency characteristics demanded for a band pass filter, such as a ladder type SAW filter.

The characteristic values herein include demanded pass band widths (BW1 and BW2), attenuation level (ATT1 and ATT2) defined by the specification, and attenuation band widths (BWatt1 and BWatt2).

A ratio (BW1/BW2) of the band widths BW2 and BW1 at a certain attenuation level is referred to as shape factor. The closer the shape factor to 1, it is better and referred to as a high shape factor. The shape factor of the ladder type SAW filter is substantially decided by the frequency difference between the resonance frequency fr and the antiresonance frequency fa.

That is, the steepness of the inclination from the attenuation region on the lower frequency side to the pass region depends on the frequency difference ($\Delta$fp in FIG. 14(b)) between the resonance frequency frp and the antiresonance frequency fap of the parallel-arm resonators $P_1$ and $P_2$, and the smaller the $\Delta$fp is, the steeper the inclination is. The steepness of the declination from the pass region to the attenuation region on the higher frequency side depends on the frequency difference ($\Delta$fs in FIG. 14(b)) between the resonance frequency frs and the antiresonance frequency fas of the series-arm resonators $S_1$ and $S_2$, and the smaller the $\Delta$fs is, the steeper the declination is.

However, the $\Delta$fp and the $\Delta$fs are substantially decided by the electromechanical coupling factor of the used piezoelectric substrate 1, and do not vary by changing the number of pairs of the electrode fingers and the aperture length of the IDT. In this connection, Japanese Unexamined Patent Publication No. Hei 11(1999)-163664 discloses a SAW filter having $\Delta$fp and $\Delta$fs that are made small by periodically withdrawing the electrode fingers of the IDT. The $\Delta$fp and the $\Delta$fs can be adjusted with a simple constitution by using the withdrawing method, so as to realize a ladder type SAW filter having a desired pass band width and steepness of the edge parts of the pass region.

Furthermore, Japanese Unexamined Patent Publication No. 2000-315931 discloses a SAW resonator having electrode fingers connected to a positive potential and a negative potential that are inverted each other, so as to increase the steepness of the filter characteristics in the vicinity of the pass band.

However, in the case where the electrode fingers of the IDT are periodically withdrawing, both the $\Delta$fp and the $\Delta$fs become small, and there is a problem in that the capacitance of the IDT is decreased by the withdrawing although a filter having a high shape factor can be realized.

The decrease in capacitance of the IDT brings about mismatch of input and output impedance, which adversely affects the characteristics of the SAW filter.

In general, enlargement of the aperture length of the IDT or increase of the number of pairs of the electrode fingers of the IDT is conducted to compensate the decrease in capacitance of the IDT. However, the enlargement of the aperture length increases the size of the IDT, which restricts the demand in miniaturization of the filter chip size made upon utilization in portable phones.

For example, when 20% of the electrode fingers are withdrawed from the whole electrode fingers of the IDT, the capacitance of the IDT is decreased by 40%, which brings about enlargement of the IDT size for compensating the capacitance of about 1.67 times. This does not match the demanded specification of realizing a compact SAW filter.

On the other hand, when the electrode pair is inverted, the decrease in capacitance of IDT can be suppressed low, and the Δfp and the Δfs can be made small, so as to realize a SAW filter of a high shape factor having a smaller size than those made by the withdrawing method. However, it is necessary that the positions where the inverted regions are provided are carefully considered as in the withdrawing method. Because when the electrode pair is inverted periodically, there is a high possibility that plural numbers of spurious occur outside the pass band of the filter, so as to fail to satisfy the demanded specification. Furthermore, when several numbers or more of the electrodes are continuously inverted, the effect of minifying the Δfp and the Δfs is impaired to bring about necessity of increasing the number of the inverted regions, and as a result the size of the filter is increased.

SUMMARY OF THE INVENTION

The invention relates to a surface acoustic wave filter comprising a piezoelectric substrate having formed thereon a plurality of surface acoustic wave resonators electrically connected in a ladder form for exciting a surface acoustic wave, wherein each of the surface acoustic wave resonators is composed of an interdigital transducer and reflectors arranged closely on both sides of the interdigital transducer in a direction parallel to a propagation direction of the excited surface acoustic wave; the interdigital transducer of at least one of said surface acoustic wave resonators is composed of a prescribed number of pairs of comb form electrodes; and the surface acoustic wave excited by the pairs of comb form electrodes contains two kinds of surface acoustic waves having phases that are different from each other by 180°.

According to the invention, the resonance frequency and the antiresonance frequency of the surface acoustic wave resonator can be made to approach each other, and the shape factor of the surface acoustic wave filter can be increased, whereby a compact surface acoustic wave filter in that decrease in capacitance of the IDT is suppressed.

BRIEF DESCRIPTION OF THE DRAWINGS

FIGS. 14(a) and 14(b) are a graph showing a pass characteristic diagram and a graph showing impedance characteristic diagrams, respectively, of a conventional ladder type SAW filter.

FIG. 18 is a constitutional diagram showing an example of a one-port surface acoustic resonator according to the invention.

FIG. 19 is a constitutional diagram showing another example of a one-port surface acoustic resonator according to the invention.

FIG. 20 is a graph showing comparison of frequency characteristics of a SAW filter of Example 4 and a SAW filter constituted with a resonator shown in FIG. 19.

DESCRIPTION OF THE PREFERRED EMBODIMENTS

Figure 1:
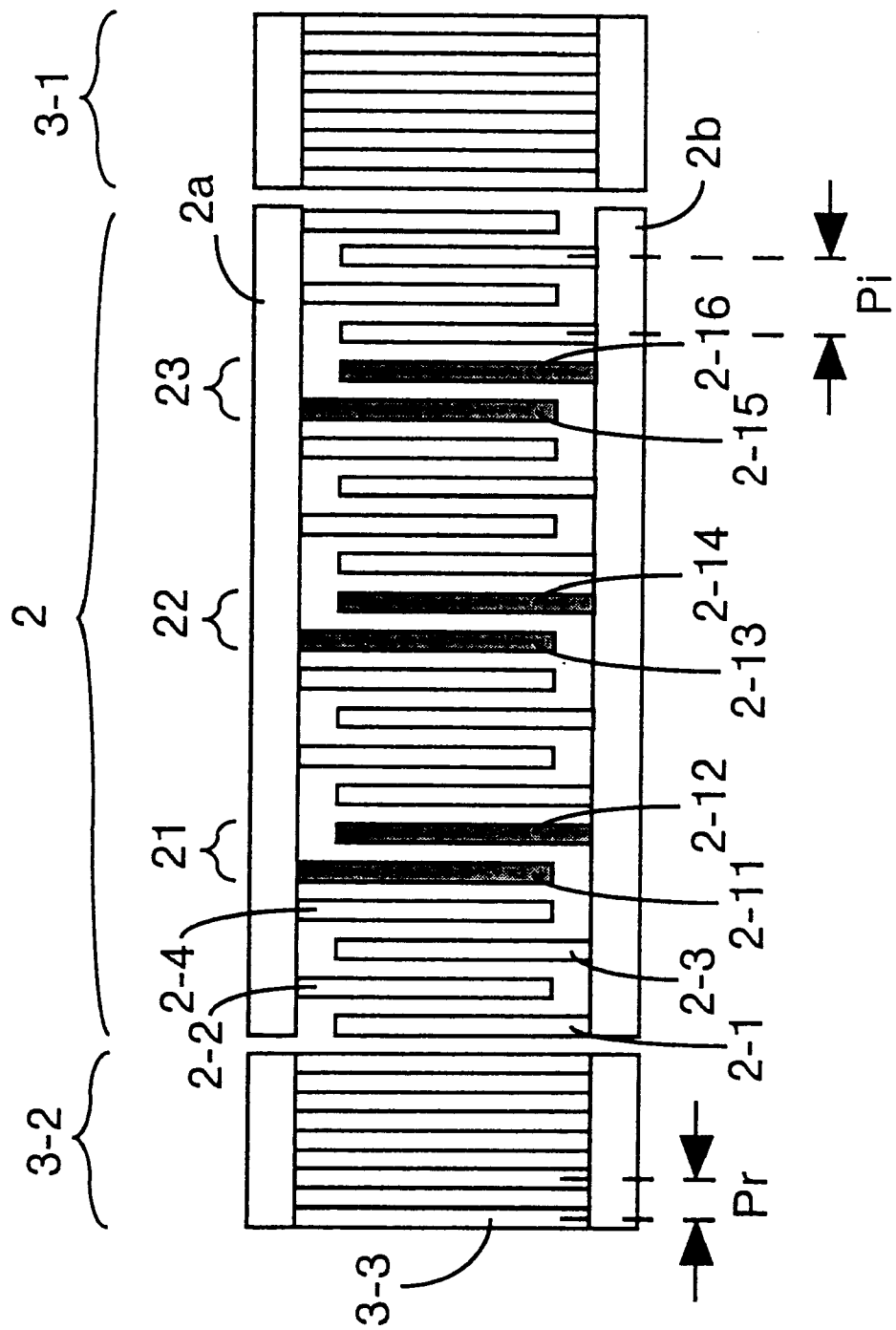
FIG. 1 is a constitutional diagram showing an example of a one-port surface acoustic wave resonator according to the invention.

The invention provides a surface acoustic wave filter comprising a piezoelectric substrate having formed thereon a plurality of surface acoustic wave resonators electrically connected in a ladder form for exciting a surface acoustic wave, wherein each of the surface acoustic wave resonators is composed of an interdigital transducer and reflectors arranged closely on both sides of the interdigital transducer in a direction parallel to a propagation direction of the excited surface acoustic wave; the interdigital transducer of at least one of the surface acoustic wave resonators is composed of a prescribed number of pairs of comb form electrodes; and the surface acoustic wave excited by the pairs of comb form electrodes contains two kinds of surface acoustic waves having phases that are different from each other by 180°.

The invention also provides a surface acoustic wave filter comprising a piezoelectric substrate having formed thereon plural surface acoustic wave resonators electrically connected in a ladder form for exciting a surface acoustic wave, wherein each of the surface acoustic wave resonators is composed of an interdigital transducer and reflectors arranged closely on both sides of the interdigital transducer in a direction parallel to a propagation direction of the excited surface acoustic wave; the interdigital transducer of at least one of the surface acoustic wave resonators is composed of a prescribed number of pairs of comb form electrodes; and the pairs of comb form electrodes is composed of first pairs of comb form electrodes exciting a first surface acoustic wave propagating in a prescribed direction and second pairs of comb form electrode exciting a second surface acoustic wave having a phase that is different from the first surface acoustic wave by 180°.

The present invention is characterized in that the interdigital transducer has first and second terminal parts arranged closely to the pairs of comb form electrodes and applied with voltages of electrically counter polarities; the pairs of comb form electrodes are each composed of two or more adjacent electrode fingers connected to the first and second terminal part, respectively; and an arrangement where the adjacent electrode fingers of the first pairs of comb form electrodes are connected to the first and second terminal parts is electrically inverse to an arrangement where the adjacent electrode fingers of the second pairs of comb form electrodes are connected to the first and second terminal parts.

It is possible that the number of pairs Ir of the second pairs of comb form electrodes satisfies the following equation 2%≦I=(Ir/Ia)×100≦22% where the ratio of the number of pairs Ir of the second parts of comb form electrodes to the total number of pairs Ia of the first and second pairs of comb form electrodes is designated as an inversion ratio I.

It is also possible that in the case where the prescribed number of the pairs of comb form electrodes constituting the interdigital transducer are divided into two or more regions each having substantially uniform numbers of pairs in a direction parallel to a propagation direction of the excited surface acoustic wave, ratios between the number of the first pairs of comb form electrodes and the number of the second pairs of comb form electrodes in all the divided regions are substantially the same.

Furthermore, it is also possible that the first pairs of comb form electrodes and the second pairs of comb form electrodes are formed so that, in the case where the prescribed number of the pairs of comb form electrodes constituting the interdigital transducer are divided into two or more regions each having substantially uniform numbers of pairs in a direction parallel to a propagation direction of a surface acoustic wave thus excited, excitation efficiencies of surface acoustic waves excited within the divided regions per one pair of comb form electrodes are substantially the same over all the divided regions.

It is also possible that the prescribed number of pairs of comb form electrodes constituting the interdigital transducer are substantially equally divided by the number of pairs of from 5 to 20 in a direction parallel to a propagation direction of the surface acoustic wave.

It is also possible in the interdigital transducer that the arrangements of the first pairs of comb form electrodes and the second pairs of comb form electrodes are aperiodic.

The aperiodic arrangement herein means that the first pairs of comb form electrodes and the second pairs of comb form electrodes are not periodically arranged, i.e., the distance between one combination of adjacent first pairs of comb form electrodes is different from the distance between another combination of adjacent first pairs of comb form electrodes (non-uniformity).

Furthermore, in the case where the prescribed number of pairs of comb form electrodes constituting the interdigital transducer are substantially equally divided into two or more in a direction parallel to a propagation direction of the surface acoustic wave thus excited, it is possible that the arrangement of the first pairs of comb form electrode and the second pairs of comb form electrodes in at least one of the divided regions are different from the arrangement of the first pairs of comb form electrode and the second pairs of comb form electrodes in any of the other divided regions.

The excitation efficiency herein means a transduction coefficient defined in the general coupling-of-modes theory and indicates an excitation efficiency by a voltage applied to the IDT (see "Introduction to Surface Acoustic Wave (SAW) Device Simulation Technique", p. 216, by K. Hashimoto Published by Realize Co., Ltd. (1997)).

The invention will be described in detail below with reference to embodiments shown in the drawings, but the invention is not construed as being limited thereto.

The constitution and the characteristics of the SAW resonator used in the SAW filter of the invention will be described.

Figure 16:
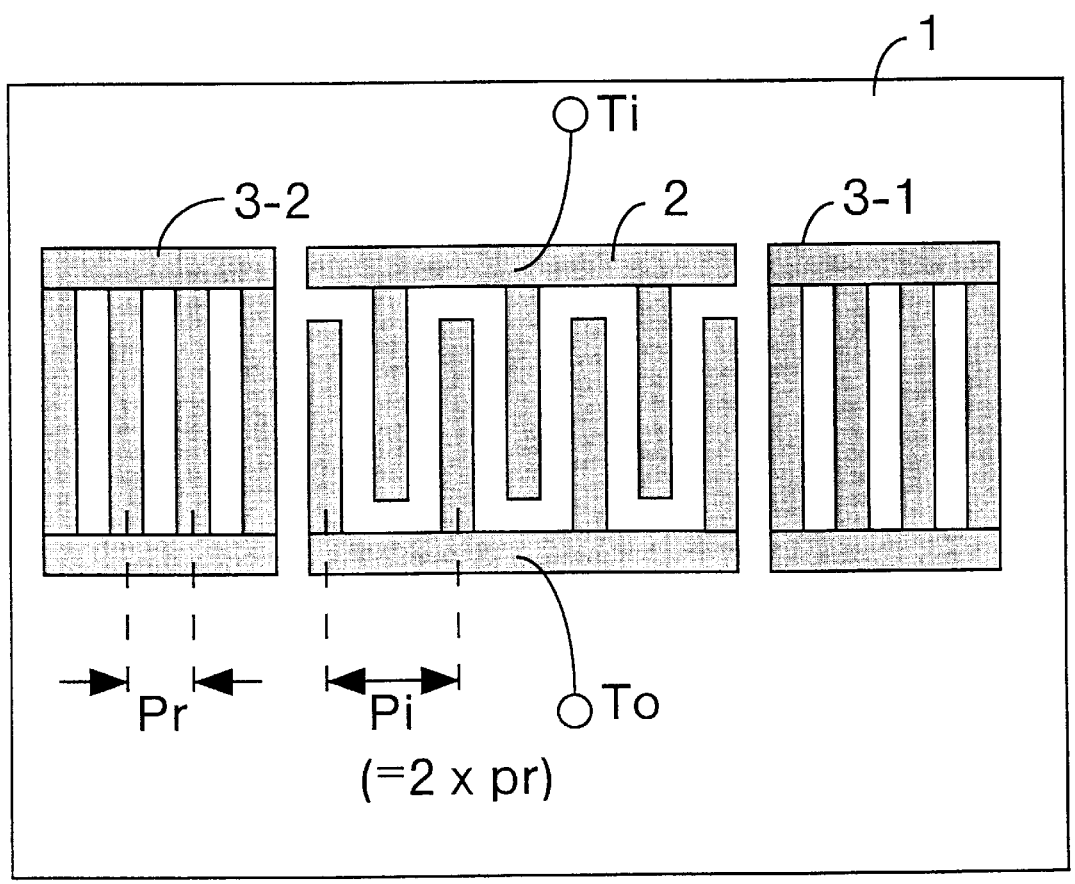
FIG. 16 is a basic constitutional diagram showing a conventional one-port surface acoustic resonator.

FIG. 16 is a basic constitutional diagram showing a conventional one-port surface acoustic resonator.

An IDT 2 (period: pi) and grating reflectors 3-1 and 3-2 (period: pr) on both sides of the IDT are formed, for example, with an Al thin film, on a piezoelectric substrate 1. It is designed in such a manner that pi/2 and pr substantially coincide with each other, and steep resonance is realized at a frequency f defined by the period pi of IDT 2 and the velocity v of the surface acoustic wave (f=v/pi).

Figure 17:
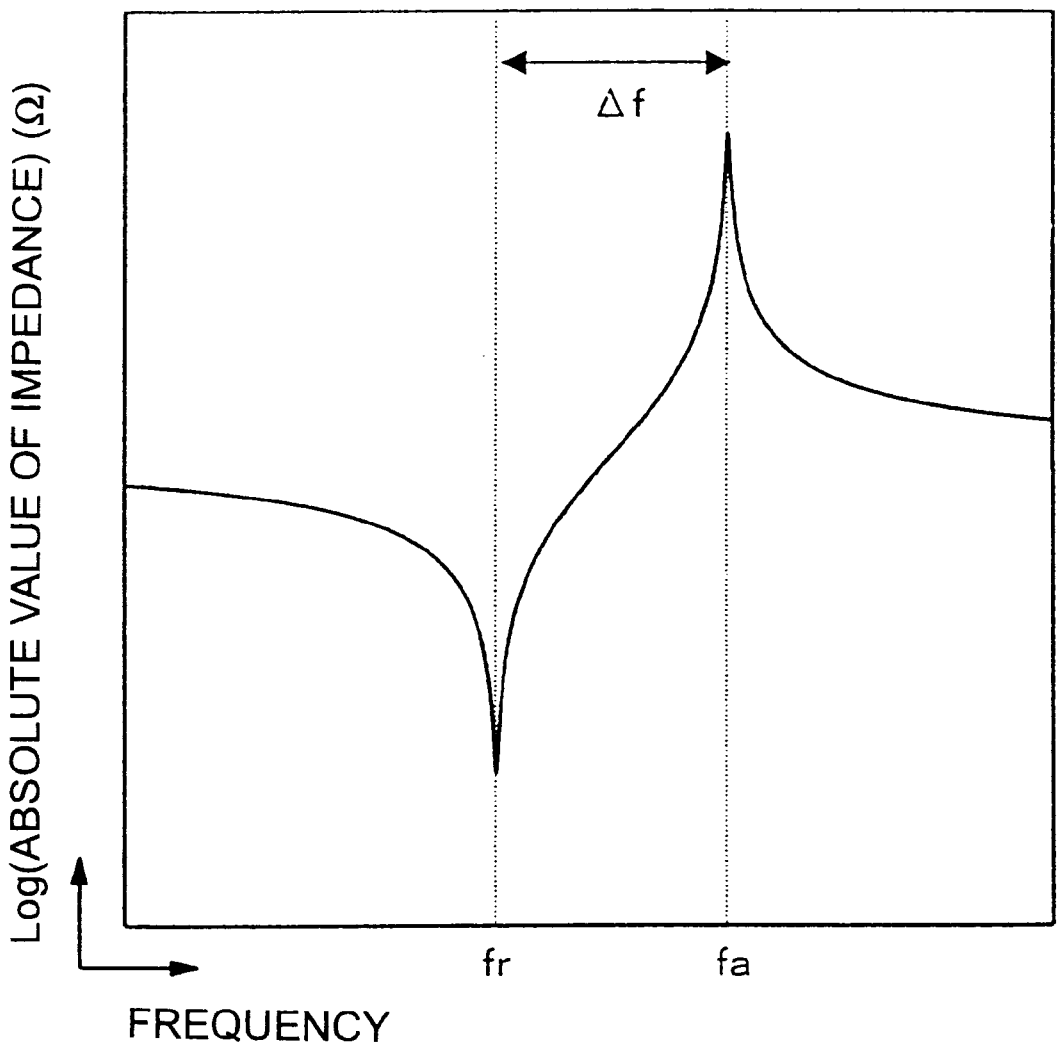
FIG. 17 is a graph showing an impedance characteristic diagram of a conventional one-port surface acoustic resonator.

FIG. 17 is a graph showing an impedance characteristic diagram of the conventional SAW resonator. In general, a SAW resonator exhibits double resonant characteristics having a resonance frequency fr and an antiresonance frequency fa as shown in FIG. 17. The symbol Δf in the figure indicates the difference of the two frequencies.

Figure 12:
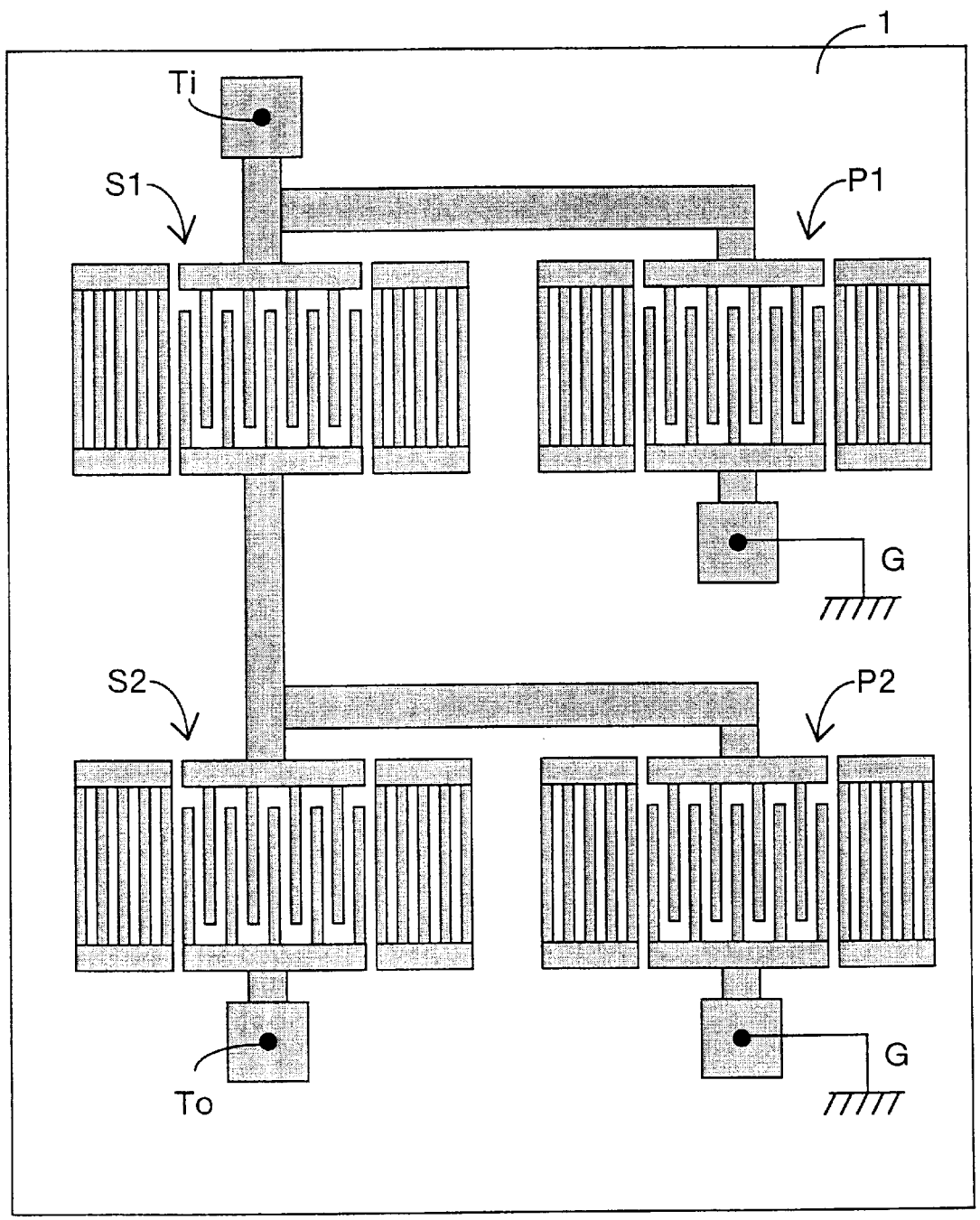
FIG. 12 is a constitutional diagram showing a conventional ladder type SAW filter.

A ladder type SAW filter has such a constitution that a number of surface acoustic wave resonators are connected in parallel and serial as shown in FIG. 12, and the IDT of the resonator is designed in such a manner that the antiresonance frequency fap of the parallel-arm SAW resonators $P_1$ and $P_2$ substantially coincide with the resonance frequency frs of the series-arm SAW resonators $S_1$ and $S_2$ (see FIG. 14(b)).

In order to improve the shape factor among the filter characteristics, it is necessary to decrease the frequency difference Δf (=fa−fr) between the antiresonance frequency fa and the resonance frequency fr of the SAW resonator as described in the foregoing.

The coupling-of-modes theory has been generally known, and simulation for a SAW filter is conducted by the theory. As a result, it has been found that when the value of the transduction coefficient ζ is made small, the antiresonance frequency fa is moved to the lower frequency side to reduce the frequency difference Δf between fa and fr.

Figure 10:
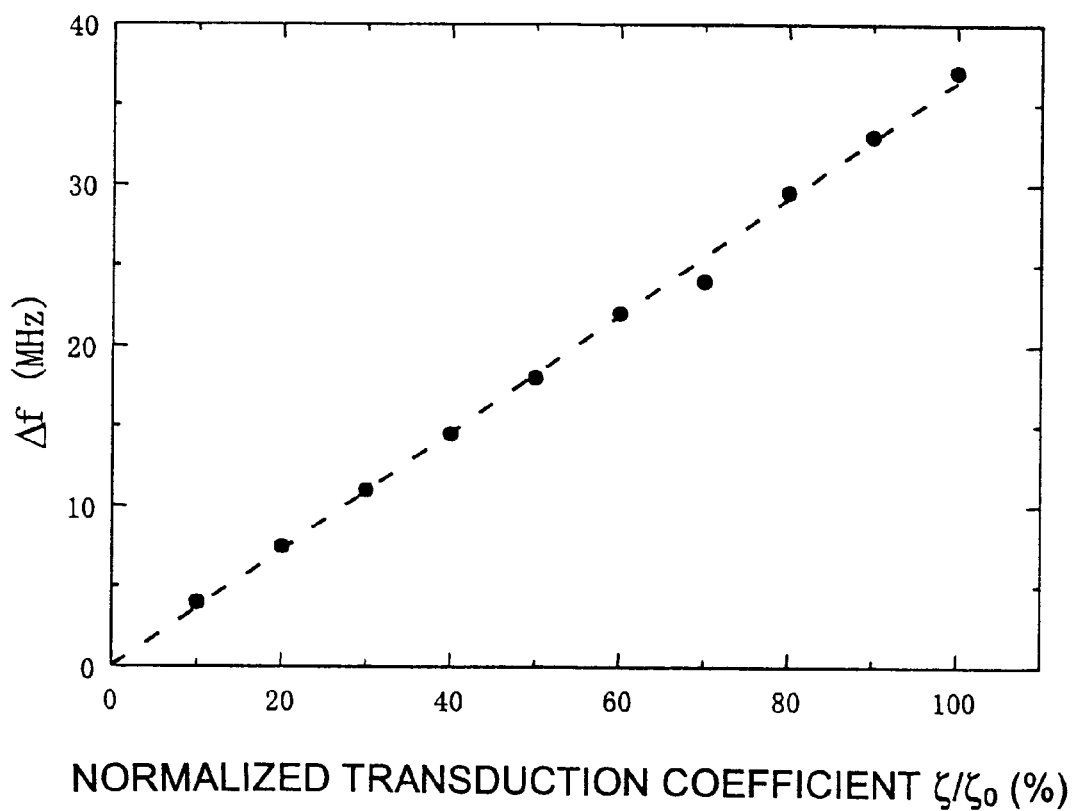
FIG. 10 is a graph showing the change of the frequency difference Δf between the resonance point and the antiresonance point depending on the normalized transduction coefficient.

FIG. 10 is a graph showing the change of the frequency difference Δf (MHz) between the resonance point and the antiresonance point depending on the normalized transduction coefficient $ζ/ζ_0$ (%).

The transduction coefficient $ζ/ζ_0$ herein means a transduction coefficient normalized by the transduction coefficient $ζ_0$ of the normal design. It indicates that the smaller the normalized transduction coefficient $ζ/ζ_0$ is, the poorer the excitation efficiency is.

It has been found from the simulation using the coupling-of modes theory that according to FIG. 10, when the excitation efficiency of the SAW in IDT 2 of the SAW resonator is decreased, the antiresonance frequency fa is moved to the lower frequency side to reduce Δf. In other words, when the excitation of the SAW in the IDT is suppressed in a greater extent, the frequency difference Δf between the resonance point and the antiresonance point becomes smaller, so as to increase the shape factor.

An example of the SAW resonator capable of reducing the frequency difference Δf between the resonance point and the antiresonance point becomes smaller to increase the shape factor will be described below.

FIG. 1 a constitutional diagram showing an example of a one-port SAW resonator according to the invention.

In FIG. 1, three inversion regions 21, 22 and 23 of electrode fingers are provided in an IDT 2. The IDT 2 is constituted with terminal parts 2a and 2b and an excitation part comprising a large number of electrode fingers (2-1, 2-2, etc.) formed in a comb form. While the electrode fingers of the inversion region are shown in the figure as two adjacent electrode fingers, they are not limited to two electrode fingers but may be three or more electrode fingers as described later.

The electrode fingers of the excitation part are necessarily electrically connected to the upper terminal part 2a or the lower terminal part 2b. For example, among the electrode fingers not in the inversion region, the electrode fingers 2-1, 2-3, etc. of odd number turns from the left side are electrically connected to the lower terminal part 2b. Among the electrode fingers not in the inversion region, the electrode fingers 2-2, 2-4, etc. of even number turns from the left side are electrically connected to the upper terminal part 2a.

A pair of adjacent electrode fingers, such as the electrode fingers 2-1 and 2-2, is referred to as a comb form electrode pair.

On the other hand, a pair of electrode fingers (one comb form electrode pair) constituting the inversion regions 21, 22 and 23 are connected to terminal parts of electrically opposite polarities to the terminal parts connected in the case of not inverted. For example, the electrode fingers, 2-11, 2-13 and 2-15 constituting the inversion regions are connected to the upper terminal part 2a, and the electrode fingers 2-12, 2-14 and 2-16 are connected to the lower terminal part 2b. That is, the two adjacent electrode fingers (for example, 2-11 and 2-12) constituting the inversion region are connected to the terminal part of the opposite polarities, and thus the arrangement of the two adjacent electrode fingers (2-11 and 2-12) in the inversion region and the arrangement of the two adjacent electrode fingers (2-3 and 2-4) in the region not the inversion region are electrically inverted to each other.

The two adjacent electrode fingers (2-11 and 2-12) in the inversion region herein correspond to the second comb form electrode pair, and the two adjacent electrode fingers (2-3 and 2-4) in the region not the inversion region correspond to the first comb form electrode pair.

With respect to the electrode fingers in the inversion region of the conventional IDT shown in FIG. 16, the electrode finger corresponding to the electrode finger 2-11 is connected to the lower terminal part 2b as similar to the electrode finger 2-1, and the electrode finger corresponding to the electrode finger 2-12 is connected to the upper terminal part 2a as similar to the electrode finger 2-2.

In the regions 21, 22 and 23 where the electrode fingers are inversely formed, a SAW having an opposite phase to the non-inversion region is excited. The opposite phase herein means the state where the phases are different by 180°. Therefore, a part of the first surface acoustic wave excited by the non-inversion region is counteracted by the second surface acoustic wave of the opposite phase excited by the inversion region, and thus the total excitation efficiency of the SAW of the IDT 2 is decreased. The decrease in excitation efficiency brings about decrease in transduction coefficient ζ in FIG. 10.

Figure 2:
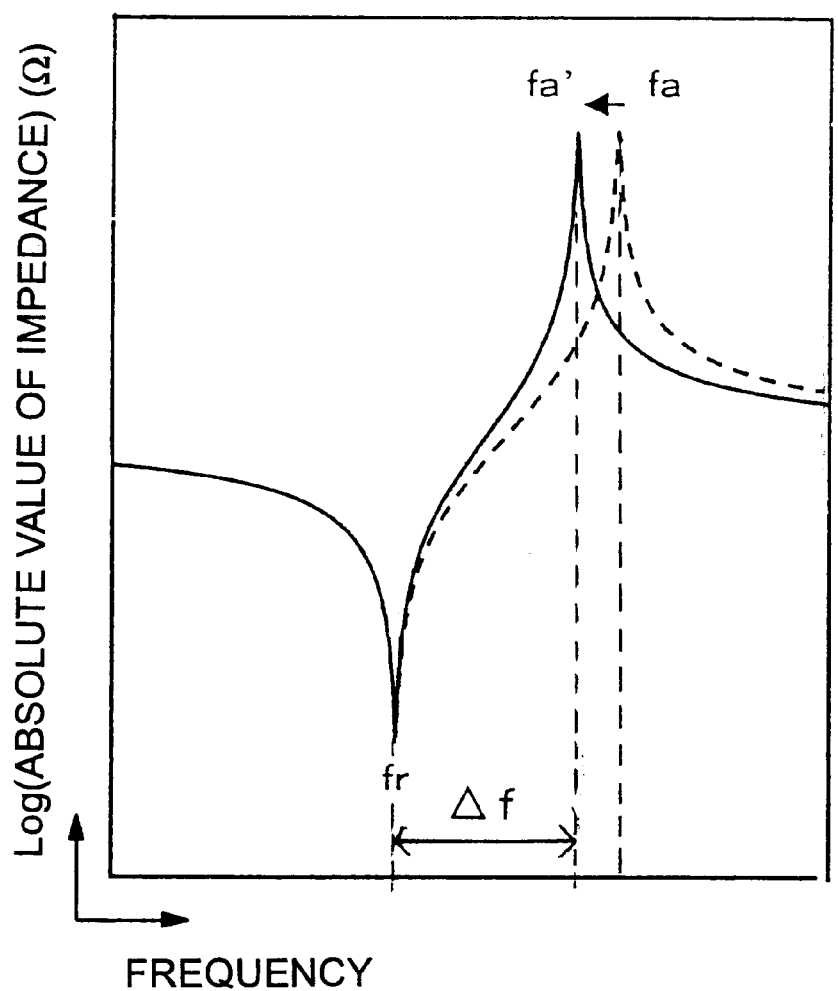
FIG. 2 is a graph showing an impedance characteristic diagram of a one-port surface acoustic wave resonator according to the invention.

FIG. 2 is a graph showing an impedance characteristic diagram of the SAW resonator according to the invention shown in FIG. 1. The solid line denotes the SAW resonator of the invention shown in FIG. 1, and the broken line denotes the conventional SAW resonator shown in FIG. 16. As a result of the decrease in transduction coefficient, in the impedance characteristics of the SAW resonator, the antiresonance frequency fa is shifted to the low frequency side (from fa to fa') to decrease Δf shown in FIG. 2.

In FIG. 1, it is desired that the distances between the inversion regions are uniform. When they are non-uniform, there are high possibilities that spurious is caused in the impedance characteristics, and the effect of decreasing Δf is deteriorated. However, in the case of such a specification that the attenuation characteristics in regions distant from the pass band of the filter are important, it is desired that the distances between the inverted regions are appropriately non-uniform. When they are arranged completely in uniform or substantially in uniform, periodic spurious is caused in the region sufficiently distant from the pass band, so that the demanded specification may not be satisfied.

According to the conventional withdrawing method, Δf is adjusted by lowering the excitation efficiency of a SAW of the whole IDT utilizing the fact that the SAW is not excited in the part where the electrode fingers are withdrawed.

In the invention, on the other hand, the excitation efficiency of a SAW of the whole IDT is lowered by a SAW of the opposite phase is excited in a part of the IDT. Therefore, since the SAW of the opposite phase is generated, the excitation of the SAW can be effectively suppressed in comparison to the withdrawing method.

The inversion ratio of the electrode fingers will be described below.

The inversion ratio I herein is defined as a ratio of the number of pairs Ir of the inverted electrode fingers to the number of pairs Ia of all the electrode fingers (total pair number of the comb form electrodes) constituting one IDT. That is, the inversion ratio I can be expressed by the equation I=(Ir/Ia)×100(%). The number of pairs of the electrode fingers means the number of comb form electrode pairs, and for example, the electrode fingers 2-1 and 2-2 in FIG. 1 are counted as one pair. Therefore, when the total number of the electrode fingers of the IDT is 100, the total number of pairs of the electrode fingers Ia is 50. In the case where the comb form electrode pair in the inversion region is constituted by the two electrode fingers 2-11 and 2-12 as in FIG. 1, the two electrode fingers are counted as one pair. In the case where the comb form electrode pair in the inversion region is constituted by adjacent three electrode fingers as described later with reference to FIG. 3, the three electrode fingers are counted as 1.5 pairs.

The value R (withdrawing ratio) showing the ratio of the number of pairs Im of the withdrawed electrode fingers is expressed by the equation R=(Im/Ia)×100(%). As described later, it has been found that even when the inversion ratio I is about a half of the withdrawing ratio R (i.e., I=R/2), the equivalent reduction effect of Δf can be obtained.

That is, by using the SAW resonator of the invention shown in FIG. 1, reduction in capacitance of the IDT can be suppressed to about a half in comparison to the conventional withdrawing method, and as a result, the enlargement of the size of the IDT can also be suppressed to about a half.

The inversion ratio I preferably satisfy the range, 2%≦I≦22% from the standpoint of satisfying the demanded characteristics of a SAW filter. When the inversion ratio I is increased beyond the range, reduction in band width and deterioration of the quality factor Q of antiresonance are caused to make the practicability poor. When the inversion ratio I is less than 2%, there is substantially no change in Δf, so as to provide no improvement in shape factor.

Figure 3:
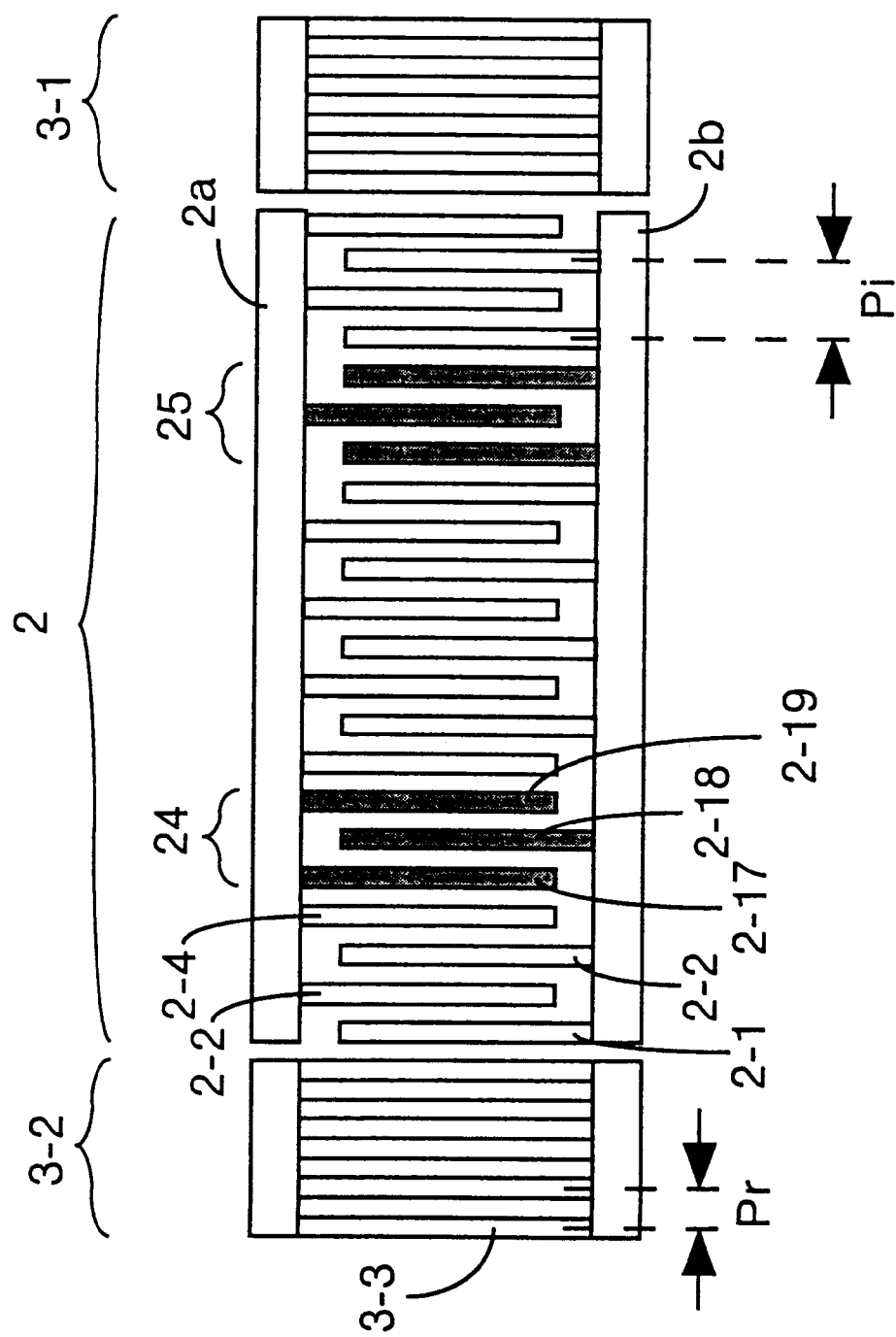
FIG. 3 is a constitutional diagram showing another example of a one-port surface acoustic wave resonator according to the invention.

FIG. 3 is a constitutional diagram showing another example of a one-port surface acoustic wave resonator according to the invention. This is a constitutional diagram, in which three adjacent electrode fingers (2-17, 2-18 and 2-19) of the IDT are alternately electrically connected to the counter terminal parts (2a and 2b) in inversion regions 24 and 25. In this constitution, as similar to the constitution of FIG. 1, the decrease in capacitance of the IDT can be suppressed, and as a result, the increase in size of the IDT can be suppressed. The inverse region may be formed with four or more electrode fingers continuously inverted. Furthermore, an inversion region formed with two electrode fingers continuously inverted as in FIG. 1 and an inversion region formed with three electrode fingers continuously inverted as in FIG. 3 may be coexisted.

Figure 4:
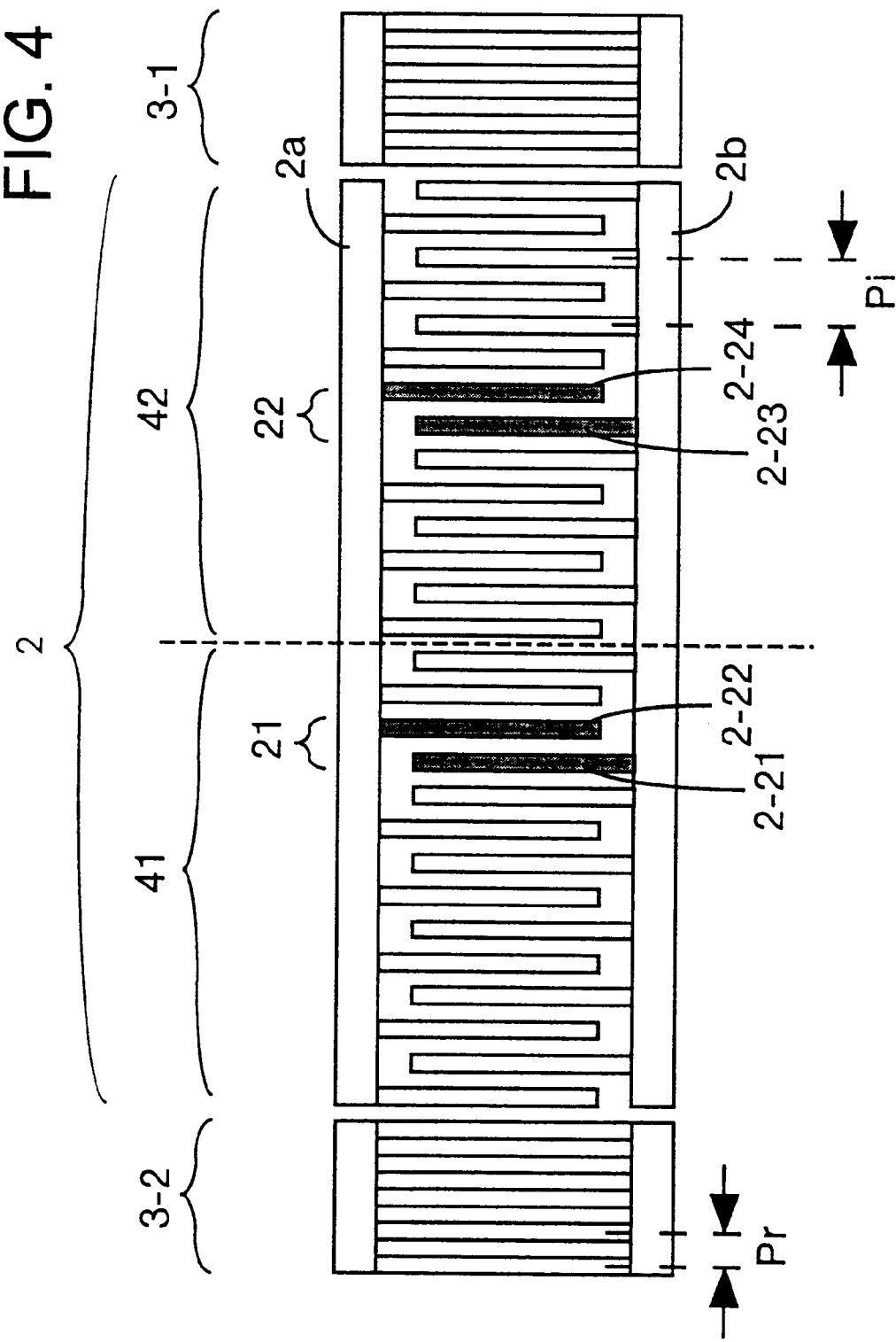
FIG. 4 is a constitutional diagram showing an example of the case in a SAW resonator according to the invention where an IDT is divided into two regions having the same inversion ratios.

FIG. 4 is a constitutional diagram showing a further example where the inversion ratios I of the two regions (41 and 42) of the IDT 2 are the same as each other. While the case where the IDT is divided into the two symmetrical regions 41 and 42 is described herein, it is not limited thereto, and the IDT may be divided into three or more regions. That is, when the IDT is divided into n of regions, the inversion ratios of all the regions are made uniform.

In FIG. 4, the number of pairs of the inverted electrode fingers (2-21 and 2-22) in the region 41 and the number of pairs of the inverted electrode fingers (2-23 and 2-24) in the region 42 are equally 1, and consequently the inversion ratios I of the regions are the same as each other. When the IDT is constituted to make the inversion ratios I of the divided regions equal to each other, filter characteristics of a high shape factor without spurious can be obtained.

In FIG. 4, the relative positions of the electrode fingers inverted particularly may not be the same as each other in all the divided regions, and it is sufficient that the inversion ratios I are the same as each other. In the case where the number of pairs of electrode fingers of the IDT to be divided into two is an odd number, the divided regions cannot be completely symmetrical, but the numbers of pairs of electrode fingers in the divided regions may not be strictly the same, and when the IDT is substantially equally divided, and the inversion regions are provided in such a manner that the two divided regions has substantially the same inversion ratio I, filter characteristics of a high shape factor can be obtained.

Particularly, in the case where the IDT 2 is equally divided into n of regions, each of which contains k of pairs of electrode fingers (particularly when k is from 5 to 20), it is possible that the excitation efficiencies per one comb form electrode pair in the equally divided regions are substantially the same as each other over all the regions.

In this case, a compact SAW filter having a high shape factor without decrease in capacitance can be obtained.

However, there are cases where the IDT cannot be equally divided by 5 to 20 pairs as depending on the number of electrode fingers of the IDT, and in such a case, the pairs of electrode fingers of the IDT remaining after the equal division may be distributed to arbitrary parts of the equally divided regions. That is, the excitation efficiencies per one pair of electrode fingers of the equally divided regions of the IDT may not be strictly the same as each other, and it is possible that the excitation efficiencies of the equally divided regions of the IDT are substantially the same as each other.

Figure 5:
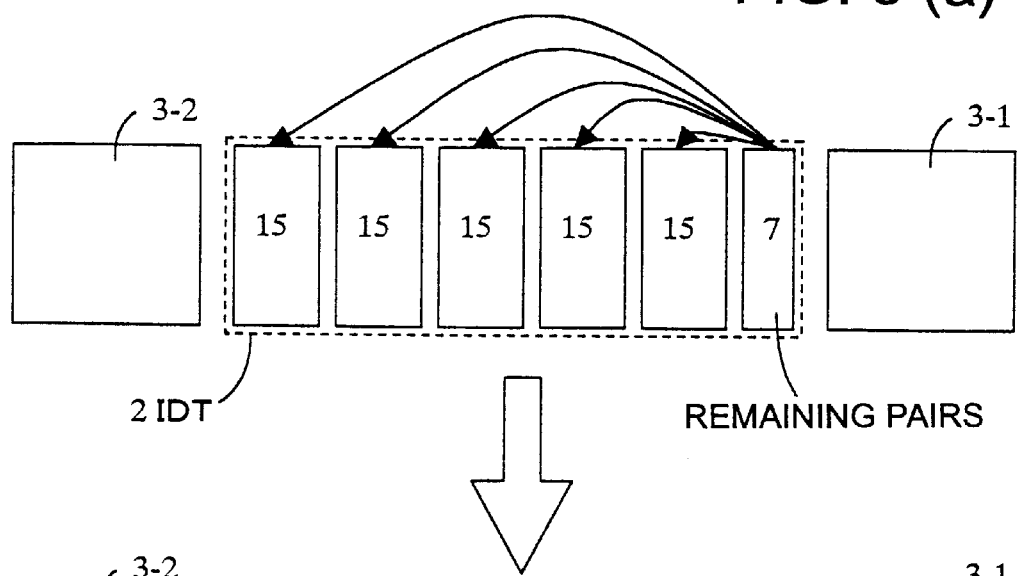
FIGS. 5(a) and 5(b) are constitutional diagrams showing an example of the case in a SAW resonator according to the invention where an IDT is substantially equally divided into regions, each of which has 15 pairs.
Figure 5:
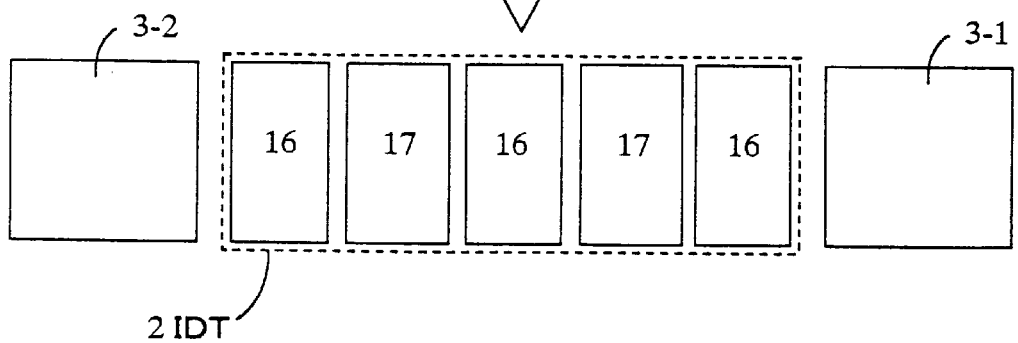

FIGS. 5(*a*) and 5(*b*) are constitutional diagrams showing an example of the case in a surface acoustic wave resonator according to the invention where an IDT 2 is substantially equally divided into regions, each of which has 15 pairs.

FIG. 5(*a*) shows the case where the IDT is constituted by 82 pairs of electrode fingers, and indicates the fact that when it is equally divided by 15 comb form electrode pairs per one region, seven pairs of electrode fingers remains after divided into five regions. In this case, because the excitation efficiency of the region formed with the seven pairs of electrode fingers is largely different from those of the other regions each formed with 15 pairs, it is preferred to distribute the seven pairs of electrode fingers to the five regions as shown in FIG. 5(*b*) from the standpoint of making the excitation efficiencies of the respective divided regions substantially equal. In this case, the IDT is constituted by three regions each having 16 pairs of electrode fingers and two regions each having 17 pairs of electrode fingers as shown in FIG. 5(*b*).

The method of distribution is not limited to the example, and in order to make the excitation efficiencies of the respective divided regions substantially equal, it is preferably designed in such a manner that the difference in number of pairs among the respective regions is one pair at most.

As described in the foregoing, even in the case where the IDT is constituted by such a number of pairs that cannot be completely equally divided, a compact SAW filter having a high shape factor and decrease in capacitance of the IDT being suppressed can be realized when the numbers of pairs of electrode fingers of the respective divided regions are substantially the same as each other. In the case where the attenuation characteristics in regions sufficiently distant from the pass band of the filter are important, it is desired that the distances between the inverted pairs of comb form electrodes are appropriately non-uniform. In other words, it is preferred that the inverted comb form electrode and the non-inverted comb form electrodes are aperiodically arranged. This is because periodic spurious is caused in the regions sufficiently distant from the pass band when they are completely uniformly or substantially uniformly arranged. When the distances between the inverted pairs of comb form electrodes are appropriately non-uniform, spurious outside the pass band can be suppressed, and a compact SAW filter having a high shape factor can also be realized.

Specific constitutional examples of the surface acoustic wave filter according to the invention will be described below.

Figure 11:
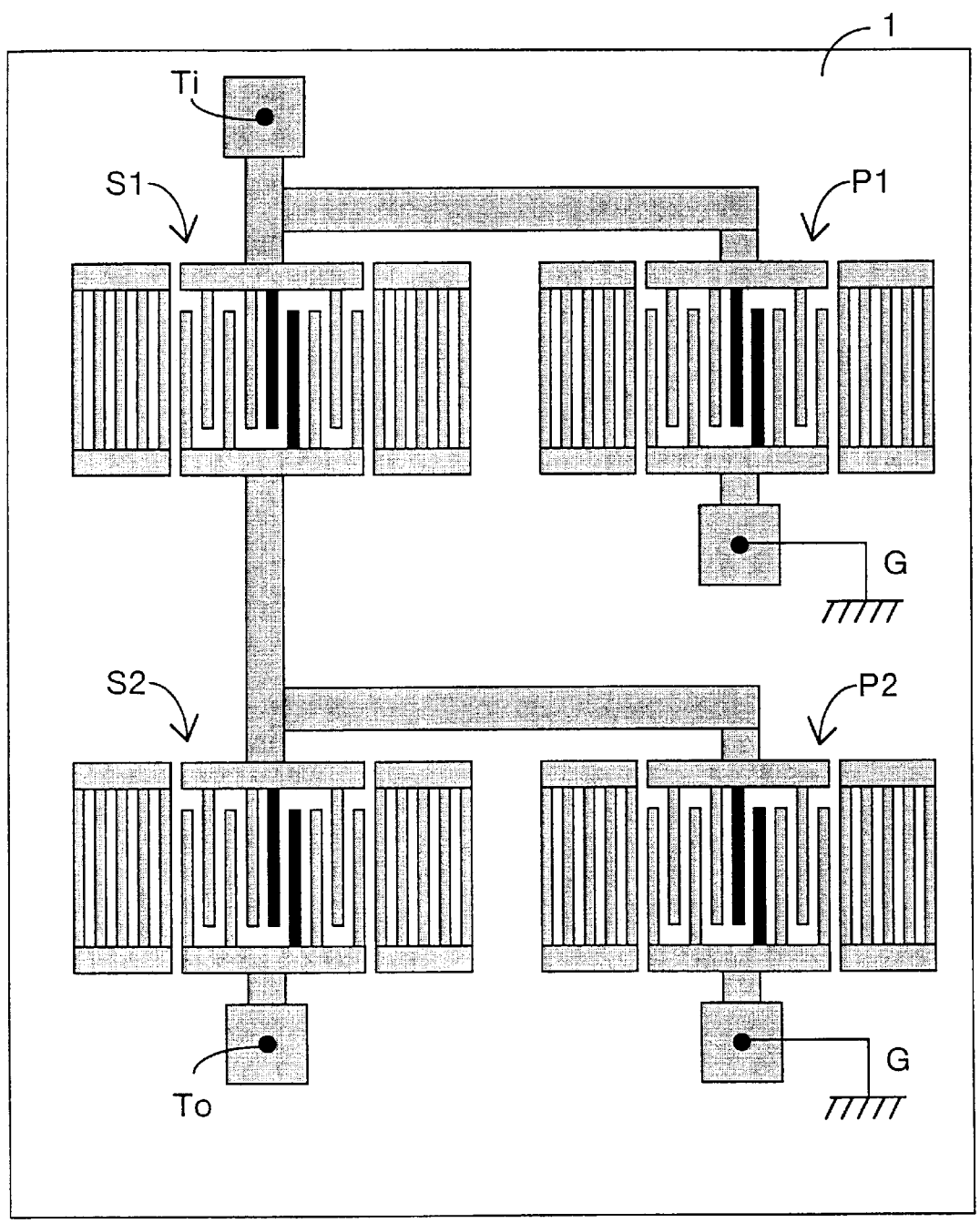
FIG. 11 is a constitutional diagram showing an example of a ladder type SAW filter using SAW resonators according to the invention.

FIG. 11 is a constitutional diagram showing an example of a ladder type SAW filter using surface acoustic wave resonators according to the invention.

This is a SAW filter having two series-arm SAW resonators $S_1$ and $S_2$ and two parallel-arm SAW resonators $P_1$ and $P_2$ as similar to the conventional ladder type SAW filter shown in FIG. 12.

However, it is different from the conventional ladder type SAW filter as shown in FIG. 12 in such a point that saw resonators having an inversion region as shown in FIG. 1 are used.

The ladder type SAW filter of the invention is not limited to that shown in FIG. 11, and it is possible that the SAW resonator of FIG. 1 is used only as the series-arm SAW resonators, but the conventional SAW resonator shown in FIG. 16 is used as the parallel-arm SAW resonators. Alternatively, the SAW resonator of FIG. 1 may be used only as the parallel-arm SAW resonators. Furthermore, the numbers of the series-arm and parallel-arm resonators are not limited to those in FIG. 11, but they may be any arbitrary numbers of three or more depending on the demanded performance and specification, and the number of the series-arm SAW resonators and the number of the parallel-arm SAW resonators may not be the same.

EXAMPLE 1

A ladder type SAW filter will be described below that uses the SAW resonator of the invention shown in FIG. 1 only as series-arm SAW resonators.

The ladder type SAW filter comprises a 42° Y-cut X-propagation LiTaO$_3$ substrate having formed thereon four SAW resonators in serial and two SAW resonators in parallel.

The SAW resonators connected in serial have the constitution shown in FIG. 1, in which the period of the IDT pi is 4.60 μm, the aperture length of the IDT is 118 μm, the number of pairs of the IDT is 116, the period of the reflectors pr is 2.30 μm, the number of electrode fingers of the reflector is 160, and the inversion ratio I of the electrode fingers of the IDT is 15%.

Figure 6:
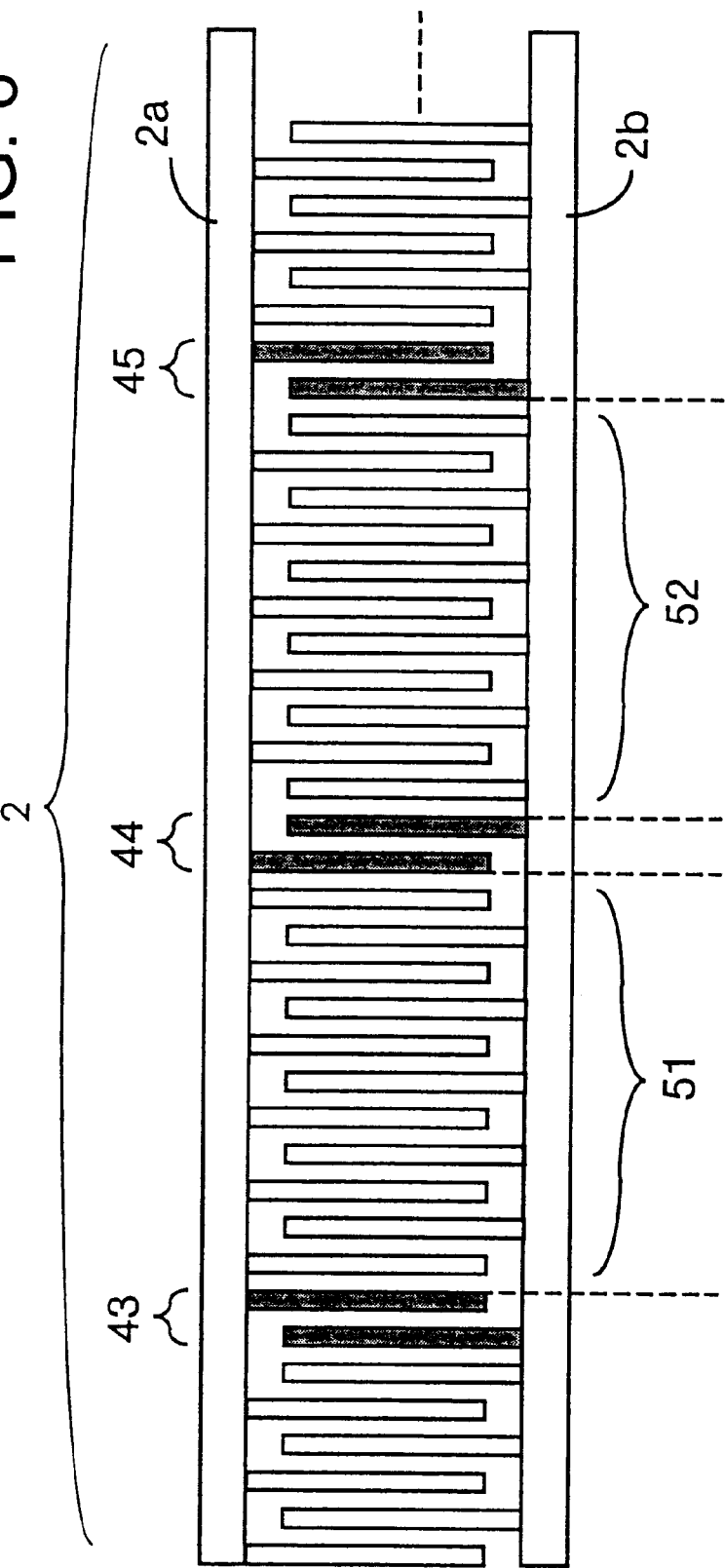
FIG. 6 is a constitutional diagram showing an example of an arrangement of inversion regions of an IDT in a SAW resonator according to the invention.

The distances between the inverted comb form electrode pairs of the IDT are the substantially equal to each other as shown in FIG. 6.

In the IDT 2 of the SAW resonator shown in FIG. 6, three inversion regions 43, 44 and 45 are provided in 20 pairs, and the regions 51 and 52 between the inversion regions are regions where the comb form electrode pairs are not inverted. The lengths of the non-inversion regions 51 and 52 in a direction that is parallel to the propagation direction of the surface acoustic wave are substantially equal to each other.

Figure 13:
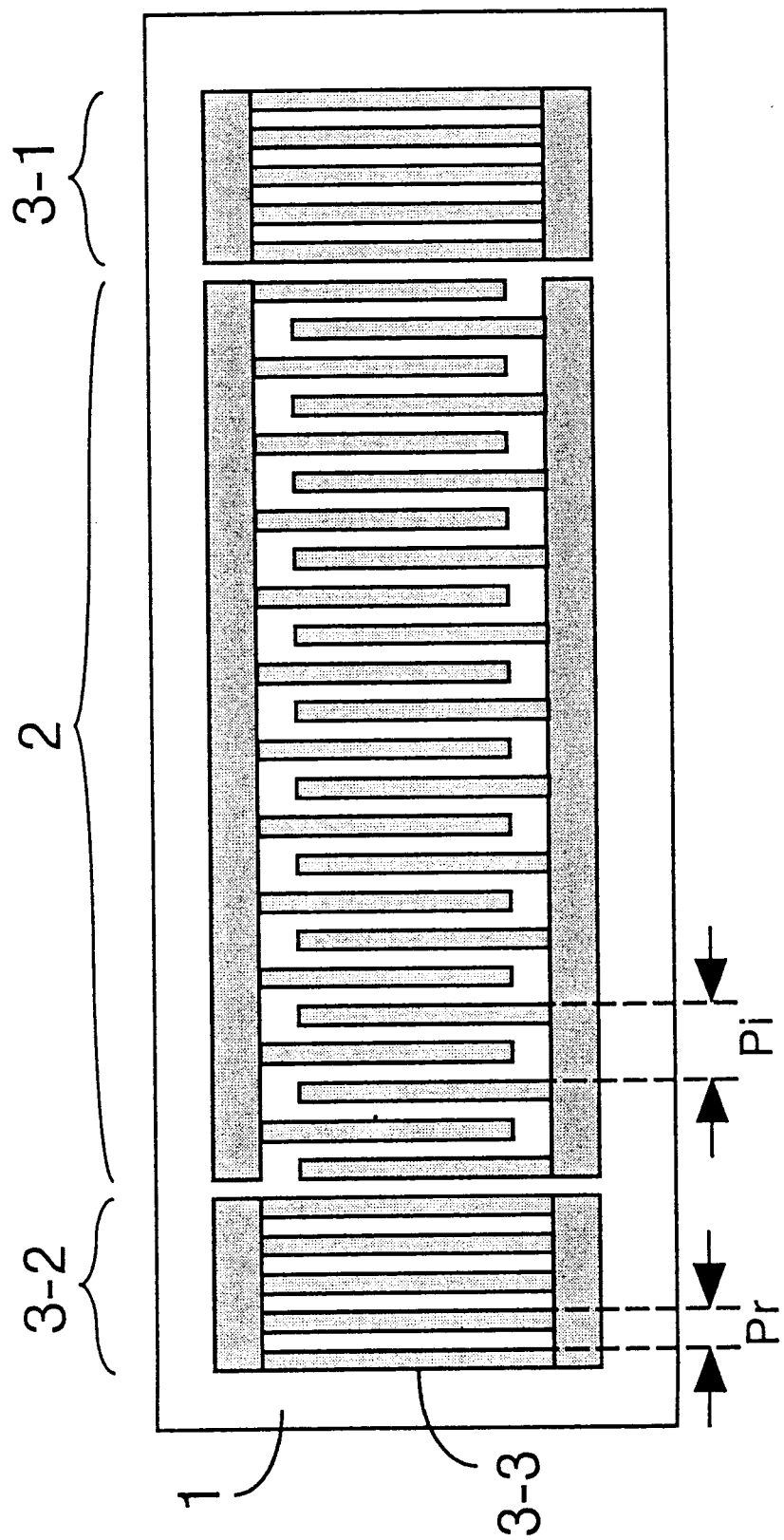
FIG. 13 is a constitutional diagram showing a general one-port SAW resonator.
Figure 15:
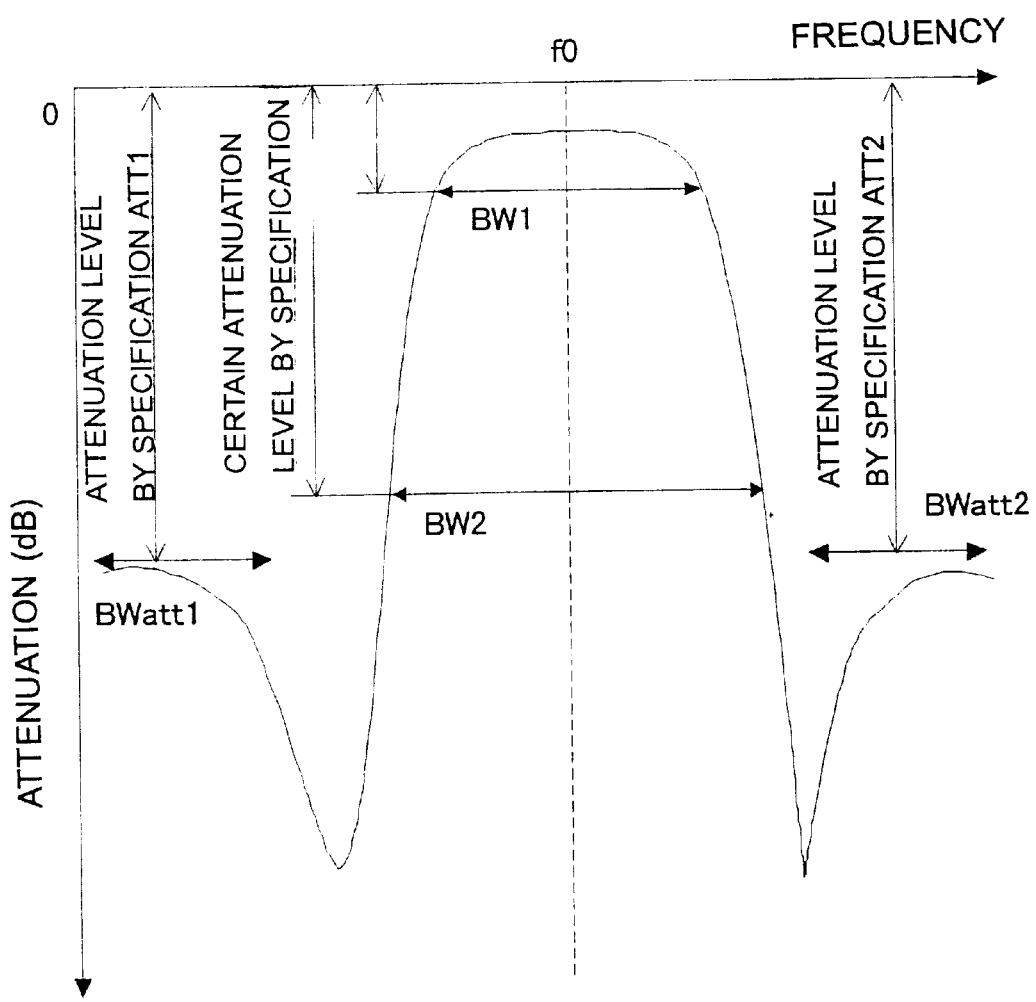
FIG. 15 is an explanatory diagram of frequency characteristics demanded for a general band pass filter.

The SAW resonators connected in parallel have the constitution shown in FIG. 13, in which the period of the IDT pi is 4.80 μm, the aperture length of the IDT is 120 μm, the number of pairs of the IDT is 78, the period of the reflectors pr is 2.40 μm, and the number of electrode fingers of the reflector is 120.

Figure 7:
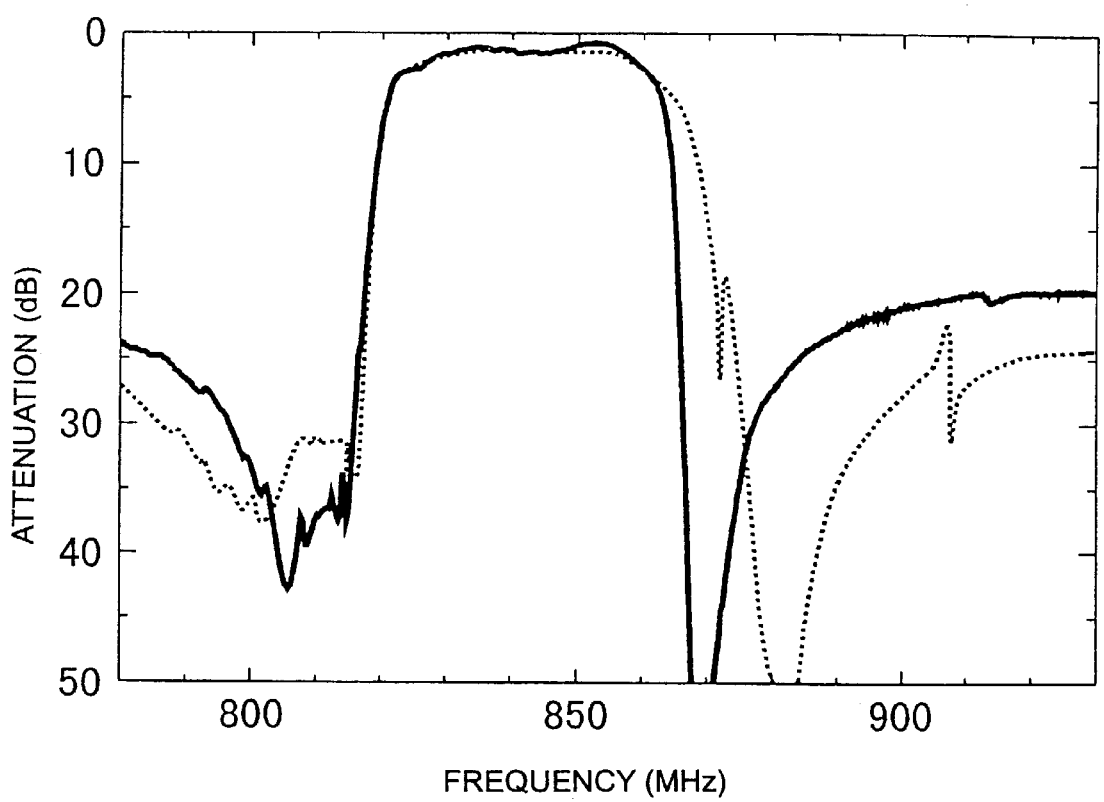
FIG. 7 is a graph showing comparison of frequency characteristics of a SAW filter of Example 1 of the invention and a conventional SAW filter.

FIG. 7 is a graph showing comparison of frequency characteristics of the SAW filter of Example 1 of the invention and a SAW filter (FIG. 12) constituted only by the conventional resonators as shown in FIG. 13. The solid line denotes the characteristic diagram of the SAW filter of the invention, and the broken line denotes the characteristic diagram of the conventional SAW filter (FIG. 12).

It is understood from the figure that because the SAW filter of the invention exhibits a smaller frequency difference Δf between the resonance point and the antiresonance point of the series-arm SAW resonators, the declination from the pass region to the attenuation region on the higher frequency side becomes steep, whereby the shape factor is improved.

In order to obtain the similar shape factor by the conventional withdrawing method, 30% of the comb form electrode pairs of the IDT of the series-arm SAW resonator should be withdrawed. In this case, the withdrawing ratio R is 30%, and the capacitance of the IDT is also decreased by 30%. In order to compensate the decrease in capacitance, the aperture length of the IDT of the series-arm SAW resonator should be expanded to 143 μm. This means enlargement of the size by 22,945 μm$^2$ in comparison to the SAW resonator that has not been withdrawed (aperture length: 100 μm). Since four SAW resonators are used in the series-arm, the enlargement of the size over the entire SAW filter is 91,780 μm$^2$.

According to Example 1 of the invention, on the other hand, the decrease in capacitance is only 15%, and thus the decrease in capacitance can be improved to a half of the case of the SAW filter constituted only by the conventional resonators shown in FIG. 13. Therefore, the enlargement of the size over the entire SAW filter for compensating the decrease in capacitance is only 38,420 μm$^2$, and thus miniaturization of the filter is realized.

EXAMPLE 2

A ladder type SAW filter will be described below that uses the SAW resonator of the invention shown in FIG. 1 only as parallel-arm SAW resonators.

The ladder type SAW filter comprises a 42° Y-cut X-propagation LiTaO$_3$ substrate having formed thereon four SAW resonators in serial and two SAW resonators in parallel.

The SAW resonators connected in serial have the constitution shown in FIG. 13, in which the period of the IDT pi is 4.64 μm, the aperture length of the IDT is 100 μm, the number of pairs of the IDT is 116, the period of the reflectors pr is 2.32 μm, and the number of electrode fingers of the reflector is 160.

The SAW resonators connected in parallel have the constitution shown in FIG. 1, in which the period of the IDT pi is 4.80 μm, the aperture length of the IDT is 141 μm, the number of pairs of the IDT is 78, the period of the reflectors pr is 2.40 μm, the number of electrode fingers of the reflector is 120, and the inversion ratio I of the electrode fingers of the IDT is 15%. The distances between the inverted comb form electrode pairs are the substantially equal to each other as shown in FIG. 6.

Figure 8:
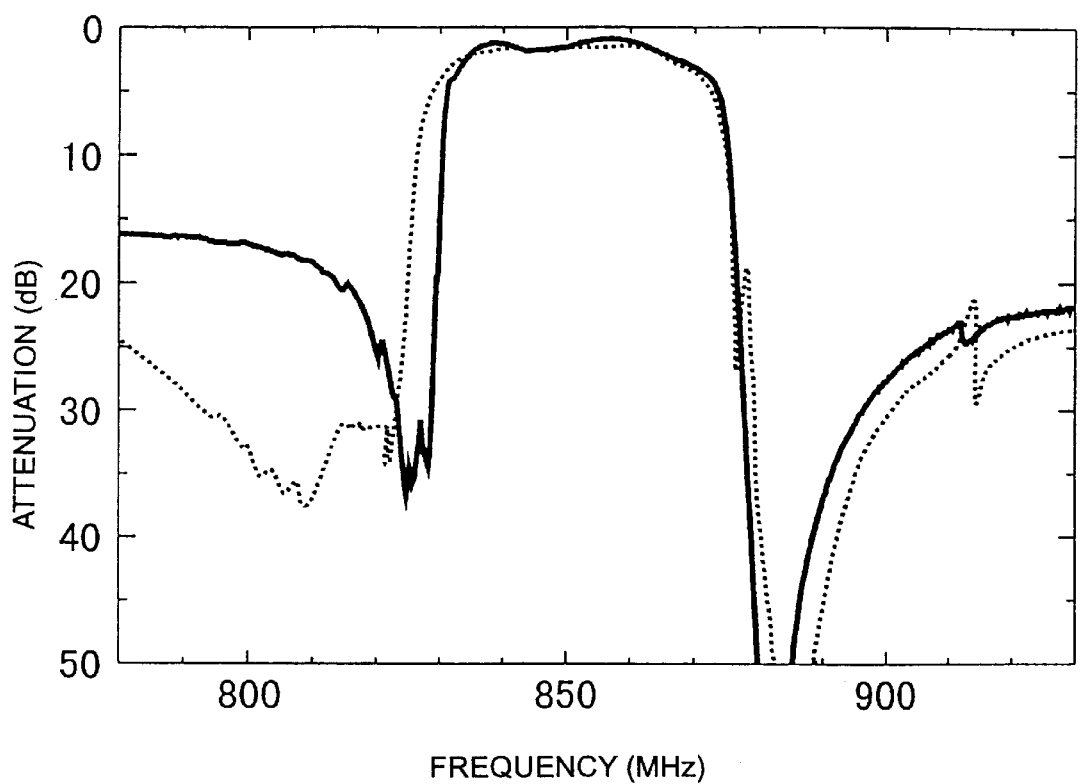
FIG. 8 is a graph showing comparison of frequency characteristics of a SAW filter of Example 2 of the invention and a conventional SAW filter.

FIG. 8 is a graph showing comparison of frequency characteristics of the SAW filters. The solid line denotes the characteristic diagram of the SAW filter of Example 2 of the invention, and the broken line denotes the characteristic diagram of the conventional SAW filter (FIG. 12).

It is understood from the figure that because the SAW filter of the invention exhibits a smaller frequency difference Δf between the resonance point and the antiresonance point of the parallel-arm SAW resonators, the inclination from the attenuation region on the low frequency side to the pass region becomes steep, whereby the shape factor is improved.

In order to obtain the similar shape factor by the conventional withdrawing method, 30% of the comb form electrode pairs of the IDT of the parallel-arm SAW resonator should be withdrawed. In this case, the withdrawing ratio R is 30%, and the capacitance of the IDT is also decreased by 30%. In order to compensate the decrease in capacitance, the aperture length of the IDT of the parallel-arm SAW resonator should be expanded to 171 μm. This means enlargement of the size by 19,094 μm$^2$ in comparison to the SAW resonator that has not been withdrawed (aperture length: 120 μm). Since two SAW resonators are used in the parallel-arm, the enlargement of the size over the entire SAW filter is 38,188 μm$^2$.

According to Example 2 of the invention, on the other hand, the decrease in capacitance is only 15%, and thus the decrease in capacitance can be improved to a half of the case of the SAW filter shown in FIG. 12 constituted only by the conventional resonators shown in FIG. 13. Therefore, the enlargement of the size over the entire SAW filter for compensating the decrease in capacitance is only 15,724 $\mu m^2$, and thus miniaturization of the filter is realized.

EXAMPLE 3

A ladder type SAW filter will be described below that uses the SAW resonator of the invention shown in FIG. 1 as all resonators on a series-arm and a parallel-arm. The ladder type SAW filter comprises a 42° Y-cut X-propagation LiTaO$_3$ substrate having formed thereon four SAW resonators in serial and two SAW resonators in parallel.

The SAW resonators connected in serial have the constitution shown in FIG. 1, in which the period of the IDT pi is 4.62 $\mu$m, the aperture length of the IDT is 118 $\mu$m, the number of pairs of the IDT is 116, the period of the reflectors pr is 2.31 $\mu$m, the number of electrode fingers of the reflector is 160, and the inversion ratio I of the electrode fingers of the IDT is 15%.

The SAW resonators connected in parallel also have the constitution shown in FIG. 1, in which the period of the IDT pi is 4.80 $\mu$m, the aperture length of the IDT is 141 $\mu$m, the number of pairs of the IDT is 78, the period of the reflectors pr is 2.40 $\mu$m, the number of electrode fingers of the reflector is 120, and the inversion ratio I of the electrode fingers of the IDT is 15%. The distances between the inverted comb form electrode pairs are substantially equal to each other as shown in FIG. 6.

Figure 9:
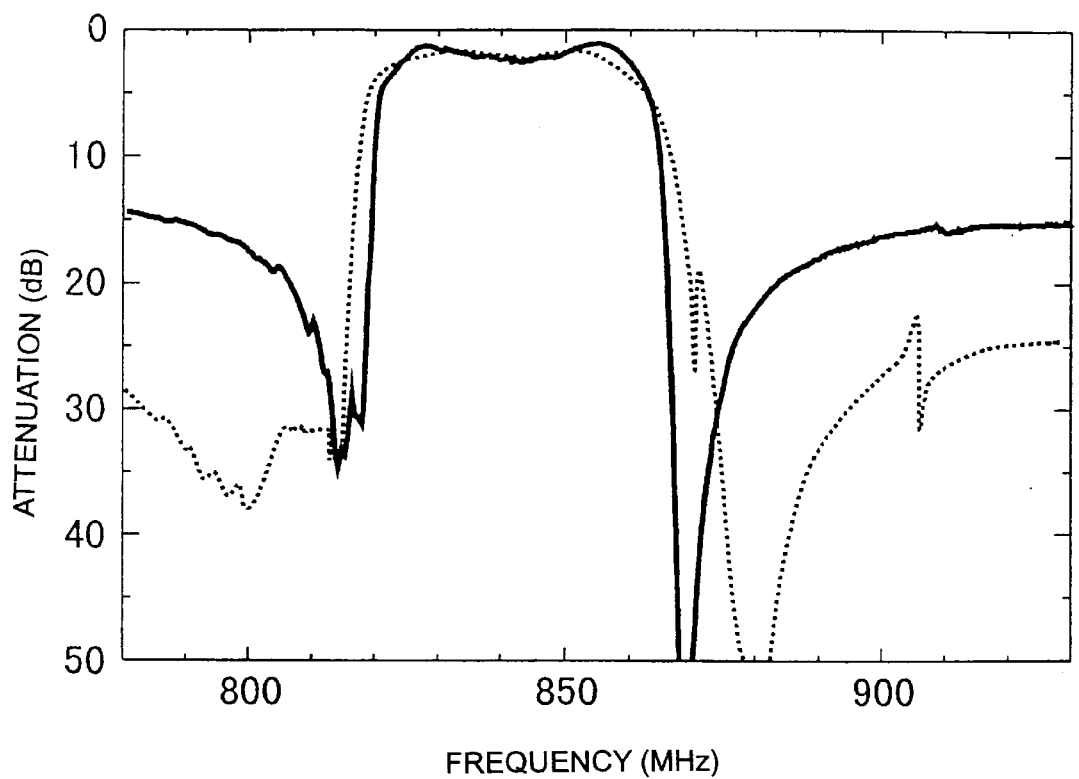
FIG. 9 is a graph showing comparison of frequency characteristics of a SAW filter of Example 3 of the invention and a conventional SAW filter.

FIG. 9 is a graph showing comparison of frequency characteristics of the SAW filters. The solid line denotes the characteristic diagram of the SAW filter of Example 3 of the invention, and the broken line denotes the characteristic diagram of the conventional SAW filter (FIG. 12).

It is understood from the figure that because the SAW filter of the invention exhibits a smaller frequency difference Δf between the resonance point and the antiresonance point of the series-arm and parallel-arm SAW resonators, both the inclination from the attenuation region on the lower frequency side to the pass region and the declination from the pass region to the attenuation region on the higher frequency side become steep, whereby the shape factor is improved.

In order to obtain the similar shape factor by the conventional withdrawing method, 30% of the comb form electrode pairs of the IDT of the series-arm and parallel-arm SAW resonator should be withdrawn. In this case, the withdrawing ratio R is 30%, and the capacitance of the IDT is also decreased by 30%. In order to compensate the decrease in capacitance, the aperture length of the IDT of the series-arm SAW resonator should be expanded to 143 $\mu$m, and the aperture length of the IDT of the parallel-arm SAW resonator should be expanded to 171 $\mu$m. Since four SAW resonators are used in the series-arm, and two SAW resonators are used in the parallel-arm, the enlargement of the size over the entire SAW filter is 129,968 $\mu m^2$ in comparison to the SAW filter constituted only by the SAW resonators that have not been withdrawed.

According to Example 3 of the invention, on the other hand, the decrease in capacitance is only 15%, and thus the decrease in capacitance can be improved to a half of the case of the SAW filter shown in FIG. 12 constituted only by the conventional resonators shown in FIG. 13. Therefore, the enlargement of the size over the entire SAW filter for compensating the decrease in capacitance is only 54,144 $\mu m^2$, and thus miniaturization of the filter is realized.

EXAMPLE 4

A ladder type SAW filter will be described below that uses the SAW resonator of the invention shown in FIG. 18 as resonators on a serial-arm. The ladder type SAW filter comprises a 42° Y-cut X-propagation LiTaO$_3$ substrate having four SAW resonators in serial and two SAW resonators in parallel formed thereon.

FIG. 18 is a constitutional diagram of a SAW resonator having inversion regions formed non-uniformly, and FIG. 19 is a constitutional diagram of a SAW resonator having inversion regions formed uniformly. The resonator shown in FIG. 18 has an inversion ratio I of 20%. The resonators in Examples 1 to 3 having inverted pairs of comb form electrodes formed therein have substantially uniform distances between the inverted pairs of comb form electrodes. In other words, when the inversion ratio I is 20%, the inversion regions 27, 28 and 29 are provided in such a manner that one pair of comb form electrodes is periodically inverted per five pairs as shown in FIG. 19.

In the resonator shown in FIG. 18, on the other hand, the distances between the inverted pairs of comb form electrodes are differentiated from each other, and the inverted pairs of comb form electrodes and the non-inverted pairs of comb form electrodes are aperiodically arranged. When the IDT in FIG. 18 is divided into three regions, one pair among the five pairs forms the pairs of comb form electrodes 27, 28 and 29. The distances between the inverted pairs of comb form electrodes, i.e., the distance between the regions 27 and 28 being 29.9 $\mu$m and the distance between the regions 28 and 29 being 9.2 $\mu$m, are non-uniform.

In other words, in the case where the IDT 2 in FIG. 18 is divided into three regions, the positions of the inversion regions (27, 28 and 29) in the respective divided regions are differentiated from each other.

The SAW resonators connected in serial have the constitution shown in FIG. 18, in which the period of the IDT pi is 4.60 $\mu$m, the aperture length of the IDT is 125 $\mu$m, the number of pairs of the IDT is 116, the period of the reflectors pr is 2.30 $\mu$m, the number of electrode fingers of the reflector is 160, and the inversion ratio I of the electrode fingers of the IDT is 20%.

The SAW resonators connected in parallel have the constitution shown in FIG. 13, in which the period of the IDT pi is 4.80 $\mu$m, the aperture length of the IDT is 120 $\mu$m, the number of pairs of the IDT is 78, the period of the reflectors pr is 2.40 $\mu$m, and the number of electrode fingers of the reflector is 120.

FIG. 20 is a graph showing comparison of frequency characteristics between the SAW filter of Example 4 of the invention and the SAW filter constituted by using resonators having inversion regions formed periodically as shown in FIG. 19 (I=20%) on the serial-arm and conventional resonators shown in FIG. 13 on the parallel-arm. The solid line shows the SAW filter of Example 4, and the broken line shows the SAW filter constituted by using the resonator shown in FIG. 19 on the serial-arm.

It is understood from the figure that because the SAW filter of Example 4 has the non-uniform distances between the inverted pairs of comb form electrodes, spurious caused in regions (around 510 MHz, 680 MHz and 1,020 MHz in FIG. 20) distant from the pass band can be suppressed to obtain good attenuation characteristics. Furthermore, because the frequency difference Δf between the resonance point and the antiresonance point of the serial-arm SAW resonators is small in the both SAW filters, the declination from the pass region to the attenuation region on the higher frequency side become steep as similar to the characteristic shown by the solid line in FIG. 7, whereby the shape factor is improved.

In the case where the demanded specification concentrates on the attenuation characteristics in regions sufficiently distant from the pass band, if the resonators are designed in such a manner that the distances between the inverted pairs of comb form electrodes are appropriately non-uniform, spurious in regions sufficiently distant from the pass band is suppressed, and a compact SAW filter having a high shape factor can also be realized.

According to the invention, because the comb form electrode pairs constituting the IDT of the surface acoustic resonator are constituted by electrode pairs that excite two kinds of surface acoustic waves, the resonance frequency and the antiresonance frequency of the surface acoustic wave resonator can arbitrarily approach to each other.

Furthermore, according to the invention, because the frequency difference Δf between the resonance frequency and the antiresonance frequency of the surface acoustic wave resonator can be arbitrarily decreased, a ladder type SAW filter having a high shape factor can be realized. Moreover, the SAW filter of the invention can suppress the decrease in capacitance of the IDT to a half in comparison to the adjustment of the frequency difference Δf between the resonance point and the antiresonance point by the conventional withdrawing method, and therefore in the case where SAW filters having filter characteristics of the same shape factor, the SAW filter of the invention can be miniaturized in comparison to the conventional SAW filter.

According to the invention, because the first pairs of comb form electrodes and the second pairs of comb form electrodes are arranged aperiodically, i.e., the distances between the inverted pairs of comb form electrodes are differentiated from each other, spurious in the regions distant from the pass band can also be suppressed.

What is claimed is:

1. A surface acoustic wave filter comprising a piezoelectric substrate having formed thereon a plurality of surface acoustic wave resonators electrically connected in a ladder form for exciting a surface acoustic wave, wherein each of the surface acoustic wave resonators includes an interdigital transducer and reflectors arranged closely on both sides of the interdigital transducer in a direction parallel to a propagation direction of an excited surface acoustic wave;

wherein the interdigital transducer of at least one of said surface acoustic wave resonators consists of a prescribed number of pairs of comb form electrodes arranged in a sequence of the pairs along the propagation direction; and wherein each pair of the sequence further comprises a first electrode extending from an upper terminal part of the interdigital transducer and a second electrode extending from a lower terminal part of the interdigital transducer, whereby each of the pairs in the sequence has a regular orientation or an inverted orientation depending on whether the second electrode follows the first electrode along the propagation direction or the first electrode follows the second electrode along the propagation direction;

wherein at least one pair of comb form electrodes in the regular orientation exists between pairs of comb form electrodes in the inverted orientation;

whereby the surface acoustic wave excited by the pairs of comb form electrodes in the regular orientation proceeds in the propagation direction and a surface acoustic wave that differs in phase by 180° is excited by the pairs of comb form electrodes in the inverted orientation.

2. A surface acoustic wave filter as claimed in claim 1, wherein in the case where the prescribed number of the pairs of comb form electrodes constituting the interdigital transducer is divided into two or more regions each having substantially uniform numbers of pairs in the direction parallel to the propagation direction of the excited surface acoustic wave, and the number of first pairs of comb form electrodes and the number of second pairs of comb form electrodes in all the divided regions are substantially the same.

3. A surface acoustic wave filter as claimed in claim 1, wherein first pairs of where a prescribed number of the pairs of comb form electrodes constituting the interdigital transducer are divided into two or more regions each having substantially uniform numbers of pairs in a direction parallel to the propagation direction of the excited surface acoustic wave, excitation efficiencies of the surface acoustic waves excited within the divided regions per one pair of comb form electrodes are substantially the same over all the divided regions.

4. A surface acoustic wave filter as claimed in claim 2 or 3, wherein the arrangement of the first pairs of comb form electrode and the second pairs of comb form electrodes in at least one of the divided regions is different from the arrangement of the first pairs of comb form electrode and the second pairs of comb form electrodes in any of the other divided regions.

5. A surface acoustic wave filter comprising a piezoelectric substrate including formed thereon a plurality of surface acoustic wave resonators electrically connected in a ladder form for exciting a surface acoustic wave, wherein each of the surface acoustic wave resonators comprises an interdigital transducer and reflectors arranged closely on both sides of the interdigital transducer in a direction parallel to a propagation direction of the excited surface acoustic wave;

the interdigital transducer of at least one of the surface acoustic wave resonators comprises a prescribed number of pairs of comb form electrodes; and the pairs of comb form electrodes comprise first pairs of comb form electrodes exciting a first surface acoustic wave propagating in a prescribed direction, and second pairs of comb form electrodes exciting a second surface acoustic wave having a phase that is different from the first surface acoustic wave by 180°;

wherein the interdigital transducer includes first and second terminal parts arranged closely to the pairs of comb form electrodes and applied with voltages of electrically counter polarities;

the pairs of comb form electrodes each comprising two or more adjacent electrode fingers connected to the first and second terminal parts, respectively; and an arrangement where the adjacent electrode fingers of the first pairs of comb form electrodes are connected to the first and second terminal parts is electrically inverse to an arrangement where said adjacent electrode fingers of said second pairs of comb form electrodes are connected to said first and second terminal parts; and wherein the number of pairs Ir of the second pairs of comb form electrodes satisfies an equation $2\% \leq I=(Ir/Ia)\times 100 \leq 22\%$ where the ratio of the number of pairs Ir of the second pairs of comb form electrodes to the total number of pairs Ia of the first and second pairs of comb form electrodes is designated as an inversion ratio I.

6. A surface acoustic wave filter as claimed in claim 5, wherein the first pairs of comb form electrodes and the second pairs of comb form electrodes of the interdigital transducer are aperiodically arranged.

7. A surface acoustic wave filter comprising a piezoelectric substrate including formed thereon a plurality of surface acoustic wave resonators electrically connected in a ladder form for exciting a surface acoustic wave, wherein each of the surface acoustic wave resonators comprises an interdigital transducer and reflectors arranged closely on both sides of the interdigital transducer in a direction parallel to a propagation direction of the excited surface acoustic wave;

the interdigital transducer of at least one of the surface acoustic wave resonators comprises a prescribed number of pairs of comb form electrodes; and the pairs of comb form electrodes comprise first pairs of comb form electrodes exciting a first surface acoustic wave propagating in a prescribed direction, and second pairs of comb form electrodes exciting a second surface acoustic wave having a phase that is different from the first surface acoustic wave by 180°;

wherein the interdigital transducer includes first and second terminal parts arranged closely to the pairs of comb form electrodes and applied with voltages of electrically counter polarities;

the pairs of comb form electrodes each comprising two or more adjacent electrode fingers connected to the first and second terminal parts, respectively; and an arrangement where the adjacent electrode fingers of the first pairs of comb form electrodes are connected to the first and second terminal parts is electrically inverse to an arrangement where said adjacent electrode fingers of said second pairs of comb form electrodes are connected to said first and second terminal parts; and wherein the first pairs of comb form electrodes and the second pairs of comb form electrodes are formed so that, in the case where a prescribed number of the pairs of comb form electrodes constituting the interdigital transducer are divided into two or more regions each having substantially uniform numbers of pairs in a direction parallel to a propagation direction of the excited surface acoustic wave, excitation efficiencies of the surface acoustic waves excited within the divided regions per one pair of comb form electrodes are substantially the same over all the divided regions;

wherein the prescribed number of pairs of comb form electrodes constituting the interdigital transducer are substantially equally divided by the number of pairs of from 5 to 20 in a direction parallel to a propagation direction of the surface acoustic wave.

8. A surface acoustic wave filter as claimed in claim 7, wherein the arrangement of the first pairs of comb form electrode and the second pairs of comb form electrodes in at least one of the divided regions is different from the arrangement of the first pairs of comb form electrode and the second pairs of comb form electrodes in any of the other divided regions.

* * * * *